(12) United States Patent
Kondo et al.

(10) Patent No.: US 10,615,787 B2
(45) Date of Patent: Apr. 7, 2020

(54) SWITCH DRIVE CIRCUIT FOR SWITCH REDUCING LC RESONANCE

(71) Applicant: DENSO CORPORATION, Kariya, Aichi-pref. (JP)

(72) Inventors: Yohei Kondo, Kariya (JP); Tetsuya Dewa, Kariya (JP); Noriyuki Takagi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/643,863

(22) Filed: Jul. 7, 2017

(65) Prior Publication Data
US 2018/0019739 A1    Jan. 18, 2018

(30) Foreign Application Priority Data

Jul. 12, 2016  (JP) .................................. 2016-137891

(51) Int. Cl.
| | | |
|---|---|---|
| *H03K 17/04* | (2006.01) | |
| *H03K 17/042* | (2006.01) | |
| *H02M 7/5387* | (2007.01) | |

(52) U.S. Cl.
CPC ....... *H03K 17/0406* (2013.01); *H03K 17/042* (2013.01); *H02M 7/5387* (2013.01)

(58) Field of Classification Search
CPC ............ H02M 7/5387; H03K 17/0406; H03K 17/042
See application file for complete search history.

(56) References Cited

U.S. PATENT DOCUMENTS

| | | | |
|---|---|---|---|
| 5,140,201 A * | 8/1992 | Uenishi .............. | H03K 17/0406 327/108 |
| 6,323,627 B1 | 11/2001 | Schmiederer et al. | |
| 6,441,673 B1 * | 8/2002 | Zhang ................ | H03K 17/0406 327/110 |
| 7,453,292 B2 * | 11/2008 | Liu ................... | H03K 17/04123 327/108 |
| 7,551,004 B2 * | 6/2009 | Okazaki ........... | H03K 17/08122 327/108 |
| 8,319,529 B2 * | 11/2012 | Ikeda ................ | H03K 17/04123 327/108 |
| 8,450,837 B2 * | 5/2013 | Mashimo .............. | H01L 21/565 257/676 |

(Continued)

FOREIGN PATENT DOCUMENTS

| | | |
|---|---|---|
| JP | 2008-99359 A | 4/2008 |
| JP | 2009-290287 A | 12/2009 |

*Primary Examiner* — Thomas J. Hiltunen
(74) *Attorney, Agent, or Firm* — Oliff PLC

(57) ABSTRACT

The drive circuit for driving voltage controlled switches includes: charge path connected to gate of the switch, through which gate charge current flows to turn the switch ON; discharge path connected to the gate and output terminal of the switch, through which gate discharge current flows to turn the switch OFF; and at least either, a charging side element disposed on charging side loop path having the gate, a part of the charge path and the output terminal, restricting current flow to be in one direction and not disturbing current flow of charge current; or a discharging side element disposed on a discharging side loop path having the gate, a part of the discharge path and the output terminal, restricting a current flow to be in one direction and not disturbing a current flow of discharge current.

11 Claims, 18 Drawing Sheets

(56) References Cited

U.S. PATENT DOCUMENTS

| | | | | |
|---|---|---|---|---|
| 8,717,085 B2* | 5/2014 | Cioci | .................. | H03K 17/567 |
| | | | | 327/427 |
| 8,816,666 B2* | 8/2014 | Kimura | ............ | H03K 17/04123 |
| | | | | 307/140 |
| 8,847,631 B2* | 9/2014 | Tao | .................. | H03K 17/04123 |
| | | | | 327/108 |
| 9,520,789 B2* | 12/2016 | Iwamizu | ............. | H02M 3/1588 |
| 9,584,117 B1* | 2/2017 | Wang | .................. | H03K 17/687 |
| 9,685,945 B2* | 6/2017 | Osanai | ............. | H03K 17/567 |
| 9,787,301 B2* | 10/2017 | Sato | ...................... | H03K 17/567 |
| 2002/0175719 A1* | 11/2002 | Cohen | .................. | H02M 1/088 |
| | | | | 327/108 |
| 2010/0171473 A1* | 7/2010 | Kazama | .................. | H02M 1/34 |
| | | | | 323/271 |
| 2011/0221480 A1* | 9/2011 | Ikeda | ............... | H03K 17/04123 |
| | | | | 327/109 |
| 2012/0280728 A1* | 11/2012 | Hussein | ............... | H03K 17/127 |
| | | | | 327/155 |
| 2013/0039100 A1* | 2/2013 | Kazama | ............... | H03K 17/164 |
| | | | | 363/41 |
| 2013/0162322 A1* | 6/2013 | Tao | .................. | H03K 17/04123 |
| | | | | 327/381 |
| 2013/0307593 A1 | 11/2013 | Fukuta et al. | | |
| 2014/0028358 A1* | 1/2014 | Chimento | ............... | H02M 1/32 |
| | | | | 327/109 |
| 2014/0203848 A1 | 7/2014 | Miyachi et al. | | |
| 2014/0218099 A1 | 8/2014 | Yamada et al. | | |
| 2015/0137857 A1* | 5/2015 | Kusama | .................. | H02M 1/08 |
| | | | | 327/109 |
| 2017/0019095 A1* | 1/2017 | Leong | .................. | H03K 17/167 |
| 2018/0013422 A1* | 1/2018 | Leong | .................. | H03K 17/6871 |

\* cited by examiner

<RELATED ART : UPPER ARM ON>

<RELATED ART : UPPER ARM OFF>

<RELATED ART : UPPER ARM ON, DL2 RECOVERY>

⟨RELATED ART : UPPER ARM ON, DL1 RECOVERY⟩

⟨RELATED ART : OCCURRENCE OF RESONANCE⟩

<RELATED ART>

SWITCH DRIVE CIRCUIT FOR SWITCH REDUCING LC RESONANCE

CROSS-REFERENCE TO RELATED APPLICATION

This application is based on and claims the benefit of priority from earlier Japanese Patent Application No. 2016-137891 filed Jul. 12, 2016, the description of which is incorporated herein by reference.

BACKGROUND OF THE INVENTION

Technical Field

The present disclosure relates to a driving circuit that drives voltage-controlled switches.

Description of the Related Art

Such driving circuits as disclosed in JP-A-2013-240210, for example, drive switches are configured of an upper arm portion and a lower arm portion which are connected in series. The switches are IGBTs, for example. Each of the upper arm portion and the lower arm portion is configured of one switch.

As the drive circuits, some of the drive circuits drive a plurality of switches mutually connected in parallel. The parallel connected circuit composed of the switches constitutes the respective upper arm portion and lower arm portion.

In the drive circuit, capacitances are formed at a gate terminal and between the output terminals. Hence, loop paths are formed having electrical conduction paths in the drive circuit which is connected to the gate, the output terminal, and the gate-output terminal.

On the other hand, a recovery current flows through a freewheel diode connected in reverse parallel to the drive object switch. When the recovery current stops flowing, a surge voltage occurs in a conduction path of the recovery current. In this case, among the plurality of switches, the electrical potential at the output terminal of the drive object switch corresponding to the flywheel diode as a source of the surge voltage becomes relatively low compared to voltages of the output terminals in the other drive object switches. Such a voltage difference occurs because the output terminals of the plurality of drive object switches are mutually connected.

When the voltage difference occurs, LC resonance occurs between an inductance component of the above-mentioned loop path and a capacitance component of gate-output terminal. When this LC resonance occurs, the applied voltage of respective terminals such as gates and output terminals may exceed the ratings thereof, and may cause malfunctions of the switches.

The completion timing of the recovery current may vary at at least two flywheel diodes among the respective flywheel diodes, because of individual differences of the flywheel diodes. In this case, because the recovery current of the flywheel diodes subsequently stops flowing, voltage differences between output terminals of the drive object switches significantly vary. Large variation of the voltage differences is likely to cause the above-mentioned malfunctions of the drive object switches.

In order to deal with these problems, it is considered that switching rate of the switches may be lowered when the switches turn ON from the OFF state. However, in this case, power loss increases when the drive object switches turn ON.

SUMMARY OF THE INVENTION

The present disclosure is to provide a drive circuit capable of reducing LC resonance in the above-described loop paths in drive circuits for driving a plurality of voltage controlled switches mutually connected in parallel.

Hereinafter, detailed configurations of the present disclosure and effects and advantages thereof will be described.

The first aspect of the present disclosure is a drive circuit (DrH, DrL) that drives a plurality of voltage controlled switches (SH1, SH2, SL1, SL2) mutually connected in parallel, in which a flywheel diode (DH1, DH2, DL1, DL2) is connected in reverse parallel to each of the voltage controlled switches.

The drive circuit includes: a charge path (Lt, Lch) provided for each voltage controlled switch and connected to a gate of the voltage controlled switch, through which gate charge current flows to turn the voltage controlled switch ON; a discharge path (Ldis) provided for each voltage controlled switch and connected to the gate and an output terminal of the voltage controlled switch, through which gate discharge current flows to turn the voltage controlled switch OFF; and at least either, a charging side element (33A, 33B; 42A, 42B; 44A, 44B) provided for each voltage controlled switch, and disposed on a charging side loop path having the gate, a part of the charge path and the output terminal, restricting a current flow to be in one direction and not disturbing a current flow of a charge current; or a discharging side element (34A, 34B; 46A, 46B; 48A, 48B) provided for each voltage controlled switch, and disposed on a discharging side loop path having the gate, a part of the discharge path and the output terminal, restricting a current flow to be in one direction and not disturbing a current flow of discharge current.

According to the first aspect, a charge path and a discharge path are provided, where gate charge current and gate discharge current flow through these paths respectively. In each of switches, a gate-output terminal capacitance is formed. Hence, at least either a charging side loop path or a discharging side loop path is formed for respective switches. The charging side loop path includes a gate, at least a part of the charge path and the output terminal. The discharging side loop path includes a gate, at least a part of discharge path and the output terminal. In the case where the loop paths are formed, because of difference between completion timings of recovery current flow of at least 2 flywheel diodes in flywheel diodes reversely connected in parallel to the switches, LC resonance occurs in the loop path.

Therefore, according to the first aspect, at least either a charging side element is provided in the charging side loop path or a discharging side element is provided in the discharging side loop path. The charging side element restricts the current to flow only in the one direction and not disturbing the gate current flow. When the configuration of the present disclosure includes the charging side element, in the charging side loop path, the charging side element restricts the current flowing to be in one direction only. Therefore, LC resonance can be reduced in the charging side loop path.

On the other hand, the discharging side element is provided such that current flowing is restricted to be in one direction and flow of the gate discharge current is not disturbed. When the configuration of the present disclosure includes the discharging side element, the discharging element restricts the direction of the current flow to only one direction in the discharging side loop path. Hence, resonance in the discharging side loop path can be reduced.

Thus, the configuration of the first aspect can reduce LC resonance due to difference between completion timings of the recovery current of at least two flywheel diodes in the flywheel diodes reverse connected in parallel to respective switches.

Specifically, the discharging element may be provided in the discharge path as disclosed in a second aspect of the present disclosure. In this case, the discharging side element allows the current to flow in the discharging direction from the gate to the output terminal, and prevents the current from flowing in a direction opposite to the discharging direction.

Specifically, as disclosed in the third aspect, the discharging side element disposed on the discharge path may be configured of a discharging side diode arranged such that an anode is connected to the gate side and a cathode is connected to the output terminal side. According to a configuration using the discharging side diode, electronic control is not necessary so that LC resonance can be reduced simply.

According to the fourth aspect of the present disclosure, the drive circuit includes a discharge switch (36; 36A, 36B) disposed in the discharge path to be closer to the output terminal side than to the discharging side element; and an OFF holding path (Loff) provided for each voltage controlled switch, which short-circuits a point closer to the gate side than to the discharging side element and the output terminal, the discharging side element (46A, 46B; 48A, 48B) is provided in the OFF holding path; the discharging side element provided in the OFF holding circuit allows current to flow in a predetermined direction from the gate to the output terminal and prevents current from flowing in a direction opposite to the predetermined direction.

The configuration of the fourth aspect includes the OFF holding path provided for each switch in order to maintain the OFF state of the switch when the switch is driven to be OFF. Also, in the above-mentioned disclosure, the discharging element is further provided in the OFF holding path. The discharging side element provided in the OFF holding circuit allows the current to flow in the predetermined direction from the gate to the output terminal, and prevents the current from flowing in a direction opposite to the predetermined direction. Thus, LC resonance can be reduced in the discharging side loop path having the gate, a part of the discharge path, the OFF holding path and the output terminal.

Specifically, as disclosed in the fifth aspect of the present disclosure, the discharging side element provided in the OFF holding path can be used, which is configured of an OFF side diode (46A, 46B) arranged such that an anode is connected to the gate side and a cathode is connected to the output terminal side. In this case, according to the fifth aspect, a first OFF holding switch (47A, 47B) can be provided in the OFF holding path, the OFF holding switch turns ON when an OFF drive command is indicated on a corresponding switch.

According to the fifth aspect of the present disclosure, other than a case where the discharge switch is turned ON so as to turn switches OFF, the OFF holding switch corresponding to the switches is turned ON, whereby a part of the plurality of switches can be turned OFF.

Specifically, as disclosed in the sixth aspect of the present disclosure, the discharging side element provided in the OFF holding path can be configured of a second OFF holding switch that electrically disconnects between the gate and the output terminal when being turned OFF, and allows current to flow in the predetermined direction and prevents current from flowing in a direction opposite to the predetermined direction when being turned ON.

The OFF holding switch can function as the OFF side diode of the fifth aspect and the OFF holding switch. Hence, according to the sixth embodiment, in addition to the effects obtained from the fifth aspect, an effect can be obtained that the number of components of the drive circuit is reduced.

According to the seventh aspect of the present disclosure, the drive circuit includes a resistor (60A, 60B) provided for each voltage controlled switch, which connects a point closer to the gate side than to the discharging side element and the output terminal in the discharge path, and a resistance of the resistor is set to be larger than a resistance of the discharge path.

According to the seventh aspect of the present disclosure, resistors are provided for withdrawing negative charge of the gate. For this reason, even if a discharging side loop path including the resistors is formed, the impedance in the path is still high. Therefore, attenuation in the discharging side loop path including the resistors can be large, so that LC resonance in the discharging loop path including the resistors can be reduced.

According to the eighth aspect of the present disclosure, a plurality of discharging side loop paths are formed in the drive circuit, and the discharging side element is provided for each of the discharging side loop paths.

According to the eighth aspect of the present disclosure, LC resonance can appropriately suppressed in the discharging side loop path in the drive circuit.

According to the ninth aspect, the charging path includes a power source path (Lt) connected to a power source (31); and a branch path (Lch) branched from the power path to be connected to each gate of the switches, the branch path including the charging side element, and the charging side element allows current to flow in a charging direction from the power path side to the gate and prevents current from flowing in a direction opposite to the charging direction.

In the configuration of the ninth aspect of the present disclosure, the charging side element is provided in the branch path that constitutes the charging path. The charging side element allows the current to flow in the predetermined direction from the power path side to the gate, and prevents current from flowing in a direction opposite to the predetermined direction. Thus, LC resonance in the charging side loop path can be reduced.

Specifically, as disclosed in the tenth aspect of the present disclosure, the charging side element is configured of a charging side diode (33A, 33B) arranged such that an anode is connected to the power path side and a cathode is connected to the gate side. According to this configuration using the charging side diode, electronic control is not necessary, LC resonance can be simply reduced.

According to the eleventh aspect of the present disclosure, the plurality of switches constitute parallel-connected circuits each composed of a series-connected upper arm portion (20H) and lower arm portion (20L), the switch (SH1, SH2) that constitutes the upper arm portion and the switch (SL1, SL2) that constitutes the lower arm switch are alternately ON; and the charging side element is configured of a charge switch (42A, 42B, 44A, 44B) that prevents current from flowing in the charging direction when being turned OFF, and allows current to flow in the charging direction when being turned ON.

When the charging switch is turned ON, the switch that constitutes the subject arm portion in the lower arm portion can be turned ON. Here, recovery current flows when the switch that constitutes the counter arm portion in the upper/lower arm portions is ON and the switch in the subject arm portion is OFF. Since the switch in the subject arm portion is turned OFF, the charging switch in the subject arm portion is OFF. Hence, in the case where the recovery current flows, the charging side loop path is not formed. Therefore, according to the eleventh embodiment of the present disclosure, LC resonance can be reduced in the charging side loop path.

According to the twelfth aspect of the present disclosure, a plurality of charging side loop paths are formed in the drive circuit, and the charging side element is provided for each of the charging side loop paths.

According to the twelfth aspect of the present disclosure, LC resonance can be appropriately reduced in the charging side loop path of the drive circuit.

According to the thirteenth aspect of the present disclosure, the drive circuit includes the discharging side element (34A, 34B) disposed on the discharge path, and the charge path is provided for each voltage controlled switch.

According to the thirteenth aspect of the present disclosure, the charge paths are provided for respective switches in order to individually control the switching speeds of the plurality of switches. Therefore, the charge paths corresponding to respective switches are divided from each other, so that charging side loop paths are not formed for respective switches. As a result, according to the thirteenth aspect of the present disclosure, LC resonance can be avoided in the charging side loop path.

DESCRIPTION OF THE PREFERRED EMBODIMENTS (First Embodiment)

Hereinafter, with reference to the drawings, the first embodiment of the present disclosure will be described, in which a drive circuit of the present disclosure is applied to an on-vehicle motor control system.

Figure 1:
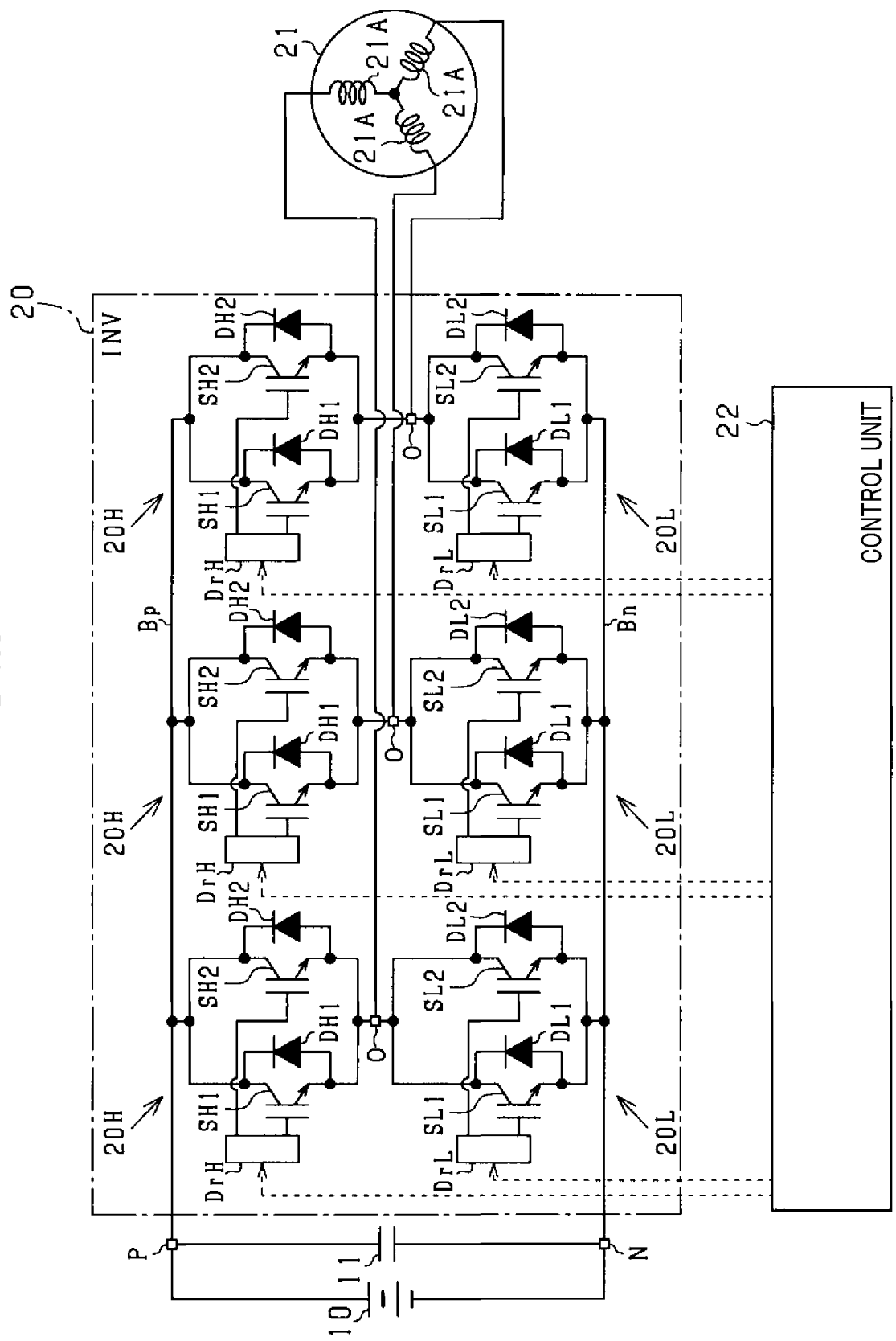
FIG. 1 is a diagram showing an overall configuration of the motor control system according to the first embodiment.

As shown in FIG. 1, the control system is provided with a DC (direct current) power source 10, an inverter 20, a motor generator 21 and a control unit 22. According to the first embodiment, the DC power source 10 is a battery having a terminal voltage exceeding 100 volts. As the DC power source, specifically, a lithium-ion secondary battery, nickel-hydrogen secondary battery are employed, for example. A capacitor 11 is connected in parallel to the DC power source 10.

The motor generator 21 is a rotary electric machine as an on-vehicle main machine. The motor generator 21 is connected to un-shown drive wheel being capable transmitting force. According to the first embodiment, as the motor generator 21, a three-phase motor generator is employed. As the motor generator 21, for example, permanent magnet synchronous motor is used. According to the first embodiment, as a main equipment, an engine which is not shown is installed in the vehicle, in addition to the motor generator 21.

The inverter 20 serves a power converter unit, in which DC power from the capacitor 11 is converted to AC (alternating current) power, and output the AC power to the motor generator 21. According to the first embodiment, the inverter is configured as a three-phase inverter and provided with an upper arm portion 20H and a lower arm portion 20L for each phase. Specifically, the inverter 20 includes three series-connected circuits for three-phase conversion, each series-connected circuit being configured of the upper arm portion 20H and the lower arm portion 20L.

The upper arm portion 20H is provided with a parallel-connected circuit including a first upper arm switch SH1 and a second upper arm switch SH2. The lower arm portion 20L is provided with a parallel-connected circuit including a first lower arm switch SL1 and a second lower arm switch SL2. At the respective input terminals of the first upper arm switch SH1 and the second upper arm switch SH2, a P terminal which is a high voltage side terminal of the capacitor 11 is connected via a high voltage side conduction member Bp such as a bus bar. At the respective output terminals of the first lower arm switch SL1 and the second lower arm switch SL2, an N terminal which is a low voltage side terminal of the capacitor 11 is connected via a low voltage side conduction member Bn such as bus bar. Each output terminal of the first upper arm switch SH1 and the second upper arm switch SH2, and each input terminal of the first lower arm switch SL1 and the second arm switch SL1 are connected to an O terminal.

At the O terminal corresponding to each phase of the three-phases, a first end of a winding 21A of a motor generator 21 is connected via the conduction member such as the bus bar. The second terminals of the winding 21A of respective phases are connected in common at the neutral point. The winding 21A is an inductive load.

According to the first embodiment, for the switches SH1, SH2, SL1 and SL2, voltage controlled type semiconductor switching elements are used, and specifically IGBTs are used. Therefore, the input terminal is the collector and the output terminal is the emitter.

For the first upper arm switch SH1, a first upper arm diode DH1 is connected in reverse parallel. For the second upper arm switch SH2, a second upper arm diode DH2 is connected in reverse parallel. For the first lower arm switch SL1, a first lower arm diode DL1 is connected in reverse parallel, and the second lower arm diode DL2 is connected in reverse parallel to the second lower arm switch SL2. According to the first embodiment, each of the diodes DH1, DH2, DL1 and DL2 corresponds to flywheel diode. It should be noted that diodes DH1, DH2, DL1 and DL2 may be integrated to respective switches SH1, SH2, SL1 and SL2, or may be attached to the respective switches SH1, SH2, SL1 and SL2 as external components.

The control unit 22 drives the inverter 20 to control a control object of the motor generator 21 to be command value. The control object is, for example, a torque. The control unit 22 outputs drive signals corresponding to respective arm portions 20H and 20L to the drive circuits DrH and DrL provided for the arm portions 20H and 20L respectively, so as to drive the switches SH1, Sh2, SL1 and SL2 of the inverter 20. The control unit 22 performs PWM processing in which three-phase command voltages having 120 degree shifted phases of electrical angle and a carrier signal such as triangular wave are compared as a magnitude comparison, so as to generate drive signals corresponding to the respective drive circuits DrH and DrL. The drive signals serve as either an ON drive command that commands the switch to turn ON, and an OFF drive command that commands the switch to turn OFF. In each phase, the drive signal corresponding to the upper arm portion 20H, and the drive signal corresponding to the lower arm portion 20L are complementary signals. Accordingly, in each phase, switches SH1 and SH1 that constitute the upper arm portion 20H, and switches SL1 and SL2 that constitute the lower arm portion 20L alternately become ON state.

Subsequently, with reference to FIG. 2, a configuration of the drive circuit will be described. The drive circuits DrH and DrL corresponding to the respective arm portions 20H and 20L according to the first embodiment have the same configuration. Therefore, according to the first embodiment, as an example, the drive circuit DrL of the lower arm portion 20L will be described.

Figure 2:
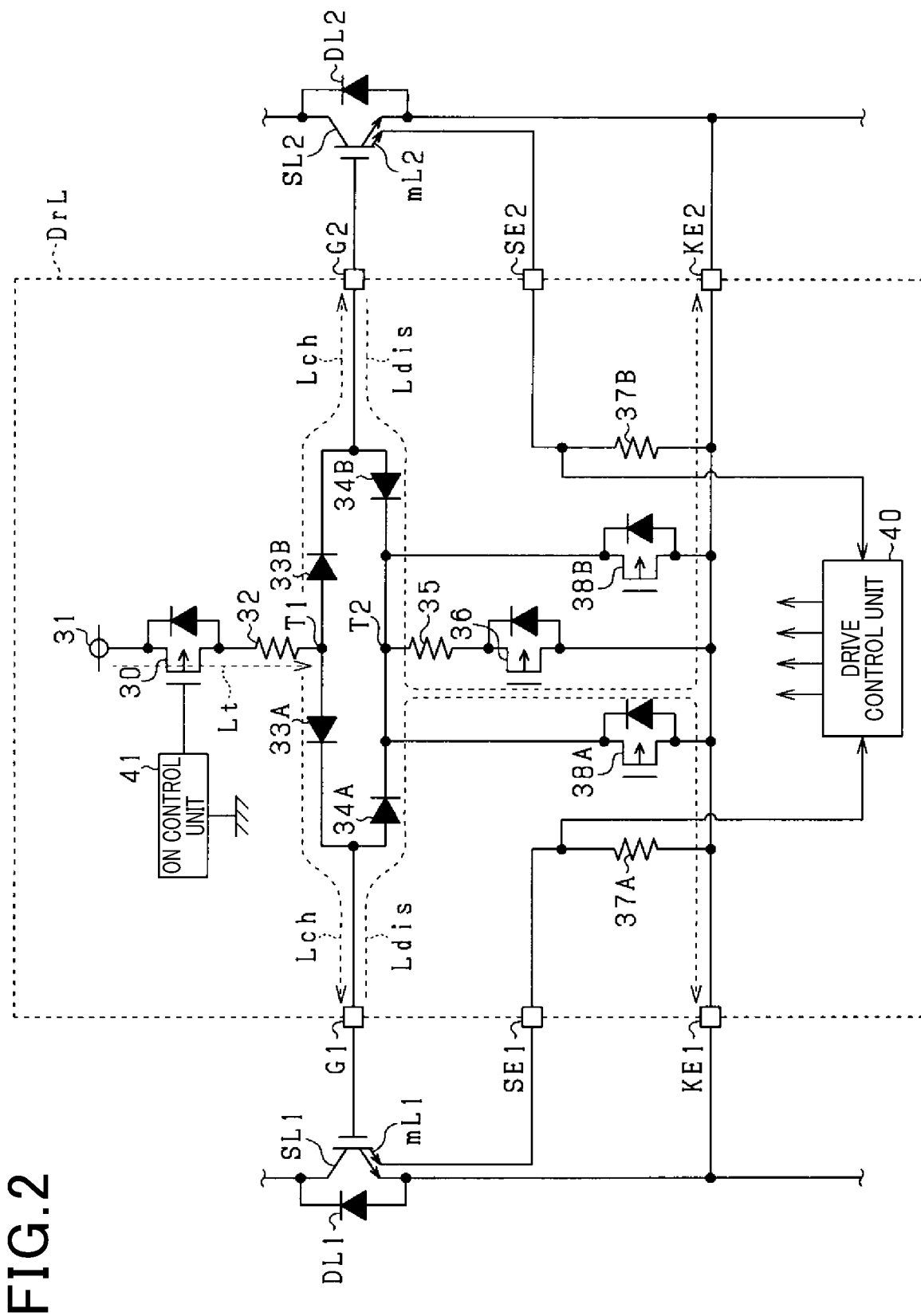
FIG. 2 is a diagram showing a drive circuit.

The drive circuit DrL shown in FIG. 2 is provided with a control board on which various electric components are mounted. In the control board, various electric components are connected by wiring patterns.

The drive circuit DrL is provided with a charge switch 30. According to the first embodiment, as the charge switch 30, a P channel MOSFET is used. A constant voltage source 31 is connected to the source of the charge switch 30, and the first end of the charge resistor 32 is connected to the drain of the charge switch 30. The first connection point T1 is connected to the second end of the charge resistor 32. According to the first embodiment, electrical conduction path from the constant voltage source 31 to the first connection point T1 via the charge switch 30 and the charge resistor 32 corresponds to power source path Lt.

At the first connection point T1, as a charging side element, anode of a first charging side diode 33A is connected. At the cathode of the first charging side diode 33A, the first gate terminal G1 of the drive circuit DrL is connected. Also, at the first connection point T1, as a charging side element, the anode of the second charging side diode 33B is connected. At the cathode of the second charging side diode 33B, the second gate terminal G2 of the drive circuit DrL is connected. According to the first embodiment, an electrical conduction path from the first connection point T1 to the first gate terminal G1 via the first charging side diode 33A, and an electrical conduction path from the first connection point T1 to the second gate terminal G2 via the second charging side diode 33B correspond to a branch path Lch which is branched from the power source path Lt.

At the first gate terminal G1, the gate of the first lower arm switch SL1 is connected. At the second gate terminal G2, the gate of the second lower arm switch SL2 is connected.

At the first gate terminal G1, as the discharging side element, anode of the first discharging side diode 34A is connected. At the cathode of the first discharging side diode 34A, the second connecting point T2 is connected. At the second gate terminal G2, as a discharging side element, the anode of the second discharging side diode 34B is connected. At the cathode of the second discharging side diode 34B, the second connection point T2 is connected.

At the second connection point T2, the first end of the discharge resistor 35 is connected. At the second end of the discharge resistor 35, a discharge switch 36 is connected. According to the first embodiment, as the discharge switch 36, an N channel MOSFET is used. Specifically, at the drain of the discharge switch 36, the second end of the discharge resistor 35 is connected. At the source of the discharge switch 36, a short-circuit path as an electrical conduction is connected so as to short-circuit the first emitter terminal KE1 and the second emitter terminal KE2 of the drive circuit DrL. At the first emitter terminal KE1, the emitter of the first lower arm switch SL1 is connected, and at the second emitter terminal KE2, the emitter of the second arm switch SL2 is connected.

In the first embodiment, an electrical conduction path from the first gate terminal G1 to the first emitter terminal KE1 via the first discharging side diode 34A, the second connection point T2, the discharge resistor 35 and the discharge switch 36 corresponds to the discharge path Ldis. Also in the first embodiment, an electrical conduction path from the second gate terminal G2 to the second emitter terminal KE2 via the second discharge side diode 34B, the second connection point T2, the discharge resistor 35 and the discharge switch 36 corresponds to the discharge path Ldis.

The first lower arm switch SL1 includes a first lower arm sense terminal mL1. The first lower arm sense terminal mL1 detects and outputs a small current correlated to the collect current flowing between the collector and emitter. The first lower arm sense terminal mL1 is connected to the first sense terminal SE1 of the drive circuit DrL. The first sense terminal SE1 is connected to a first end of the first sense resistor 37A. The second end of the first sense resistor 37A is connected to a point, in a short-circuit path that short-circuits between the first emitter terminal KE1 and the second emitter terminal KE2, to be closer to the first emitter terminal KE1 side than a connection point connected to the source of the discharge switch 36. According to this configuration, the fine current outputted from the first arm sense terminal mL1 produces a voltage drop at the first sense resistor 37A. Hence, an amount of the voltage drop at the first sense resistor 37A can be used as a correlative value to the collector current. The voltage difference across the first sense resistor 37A enters the drive control unit 40 of the drive circuit DrL as the first sense voltage. Also, the voltage difference across the sense resistor 37B enters the drive control unit 40 as the second sense voltage.

Similar to the first lower arm switch SL1, The second lower arm switch SL2 is provided with a second lower arm sense terminal mL2 that detects and outputs a small current correlated to the collector current. At the second lower arm sense terminal mL2, the second sense terminal SE2 of the drive circuit DrL is connected. The second sense terminal SE2 is connected to the first end of the second sense resistor 37B. The second end of the second sense resistor 37B is connected to a point, in a short-circuit path that short-circuits between the first emitter terminal KE1 and the second emitter terminal KE2, to be closer to the second emitter terminal KE2 side than to a connection point connected to the source of the discharge switch 36.

The drive circuit DrL is provided with a first OFF holding switch 38A and the second OFF holding switching 38B. According to the first embodiment, N channel MOSFETs are used for the OFF holding switches 38A and 38B.

The drain of the first OFF holding switch 38A is connected to an electrical conduction path which connects between the cathode of the first discharging side diode 34A and the second connection point T2. At the source of the first OFF holding switch 38A, a connection point of the second end of the first sense resistor 37A and a connection point of the second end of the second sense resistor 37B are connected in a short-circuit path that short-circuits between the first emitter terminal KE1 and the second emitter terminal KE2.

The drive control unit 40 performs charging and a discharging based on a drive signal outputted by the control unit 22 so as to drive the lower arm switches SL1 and SL2 to be ON and OFF. Specifically, as a charging process, the drive control unit 40 turns the charge switch 30 to be ON and turns the discharge switch 36 to be OFF, when the drive signal indicates an ON drive command. Hence, charge current flows from the constant voltage source 31 to the gates of the lower arm switches SL1 and SL2, causing the gate voltages of the lower arm switches SL1 and SL2 to be larger than or equal to the threshold voltage Vth. As a result, a state of the lower arm switches SL1 and SL2 is changed from OFF to ON. It should be noted that the charge switch 30 is driven by an ON control unit 41 in response to the drive control unit 40.

Meanwhile, as a discharging process, the drive control unit 40 turns the charge switch 30 to be OFF when the drive signal indicates an OFF drive command, and turns the discharging switch 36 to be ON. Thus, discharge current flows from the gates to the emitters of the lower arm switches SL1 and SL2, whereby the gate voltages at the lower arm switches SL1 and SL2 become lower than the threshold voltage Vth. As a result, lower arm switches SL1 and SL2 turn OFF.

The drive control unit 40 performs an OFF holding process to drive the first OFF holding switch 38A and the second OFF holding switch 38B, based on the drive signal outputted by the control unit 22 and the gate voltage. As the OFF holding process, the drive control unit 40, turns the OFF holding switches 38A and 38B to be ON, when the drive signal indicates OFF drive command and the gate voltage is less than or equal to a predetermined voltage Vα, and otherwise, turns the OFF holding switches 38A and 38B to be OFF. Here, the predetermined voltage Va has been set as a voltage lower than or equal to the threshold voltage Vth.

The drive control voltage 40 performs a soft-cutoff process that forcibly cuts off the lower arm switches SL1 and SL2 when overcurrent flows through the lower arm switches SL1 and SL2. The drive control unit 40 determines that overcurrent event has occurred when either the first sense voltage or the second sense voltage continuously exceeds the threshold voltage for a predetermined period. A soft cutoff path which is not shown is provided in the drive circuit DrL in order to forcibly turn the lower arm switches SL1 and SL2 OFF. The soft cutoff path connects the short-circuit path that short-circuits the first emitter terminal KE1 and the second emitter terminal KE2, and the second con-nection point T2. In the soft cutoff path, a soft cutoff switch configured of an N channel MOSFET and a soft cutoff resistor. The resistance of the soft cutoff resistor is set to be larger than the resistance of the discharge resistor 35.

Figure 3:
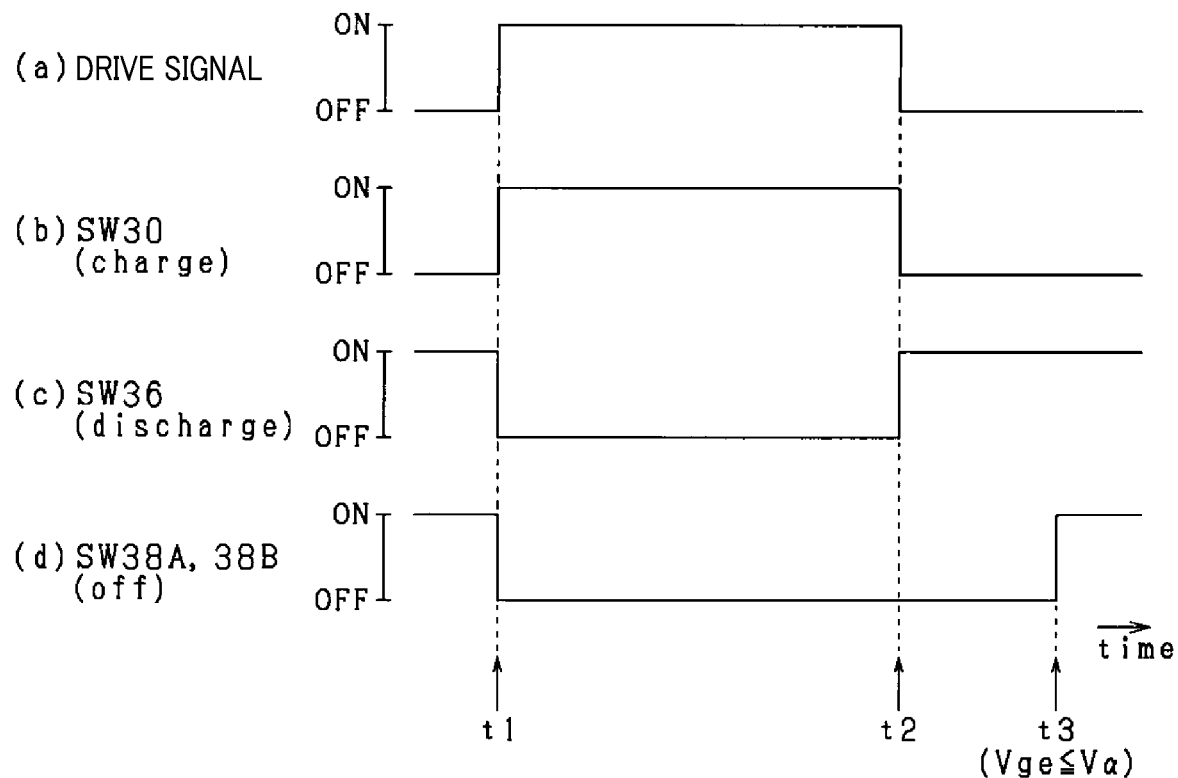
FIG. 3 is a timing diagram showing operation modes of respective switches in the drive circuit.

FIG. 3 is a diagram showing the discharging process, the charging process and the OFF holding process. Specifically, in FIG. 3, (a) shows a change in the drive signal entering the drive control unit 40, (b) shows a driving mode of the charge switch 30, (c) shows a driving mode of the discharging switch 36, and (d) shows a change in a driving mode of the first and second OFF holding switches 38A and 38B.

As shown in FIG. 3, at time t1, the drive signal is changed to an ON drive command from an OFF drive command, and then the charge switch 30 turns ON and the discharging switch 36 turns OFF to start the charging process. Thus, the gate voltages of the lower arm switches SL1 and SL2 increase to reach the threshold voltage Vth and the lower arm switches SL1 and SL2 are switched. Since the drive signal is changed to an ON drive command from an OFF drive command, the OFF holding switches 38A and 38B are turned to OFF from the ON state.

Subsequently, at time t2, the drive signal turns to OFF drive command from the ON drive signal. Therefore, the charge switch 30 turns OFF and the discharge switch 36 turns ON to start discharging process. Thus, the gate voltages of the lower arm switches SL1 and SL2 start to decrease.

At time t3, since the gate voltage becomes the predetermined voltage Vα or less, the OFF holding switches 38A and 38B are changed to the ON state to start the OFF holding process. The gate voltage used for the OFF holding process may be set to a higher gate voltage between the lower arm switches SL1 or SL2.

According to the first embodiment, as shown in FIG. 2, the drive circuit DrL is provided with the first charging side diode 33A, the second charging side diode 33B, the first discharging side diode 34A and the second discharging side diode 34B. Hereinafter, technical advantages of providing the above-described diodes will be described comparing with the related art.

Figure 4:
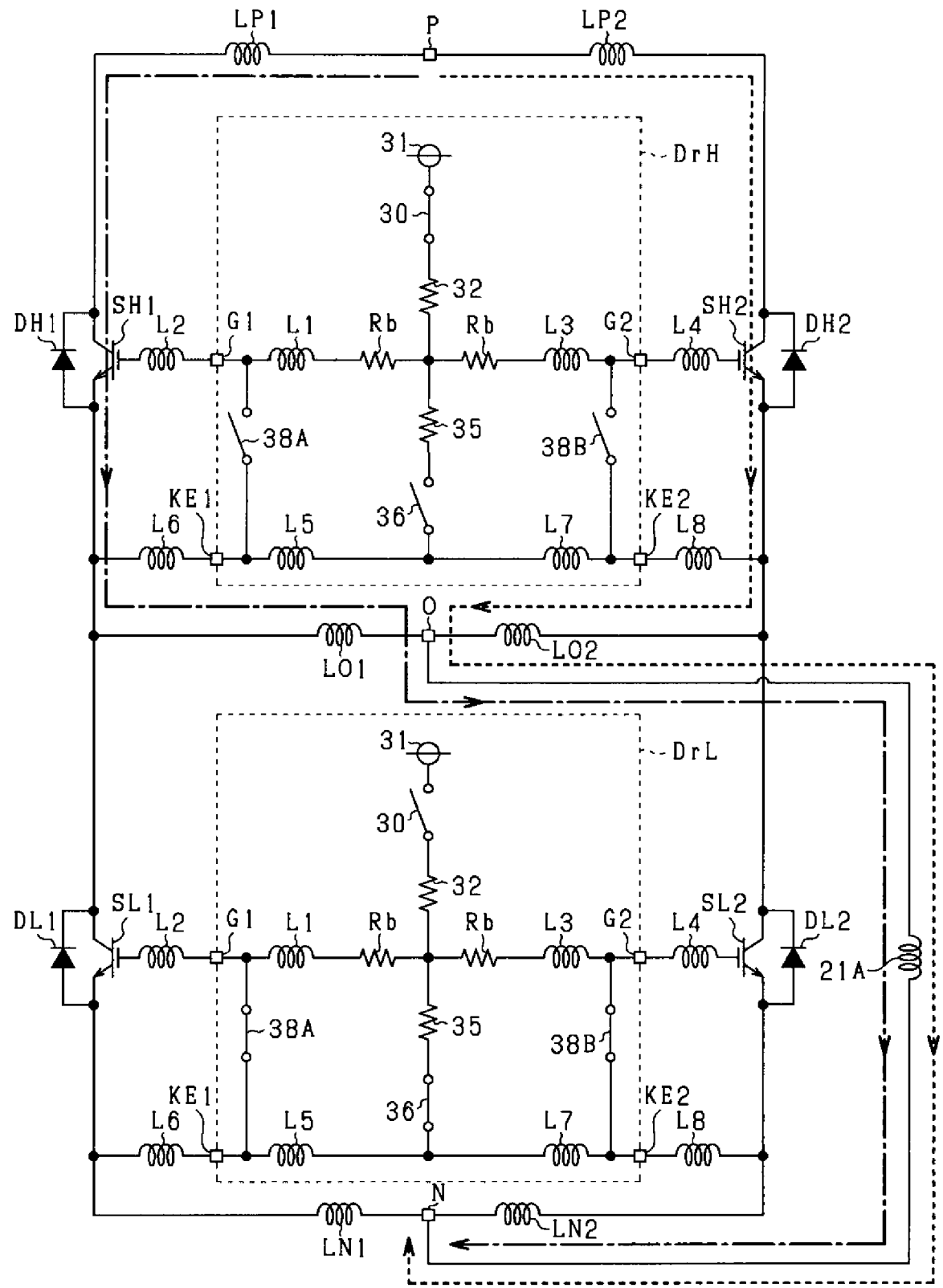
FIG. 4 is a diagram showing a mode of occurrence of LC resonance according to related art.

Firstly, related art will be described. Related art described here is defined as a configuration excluding diodes 33A, 33B, 34A and 34B from the drive circuit DrL shown in FIG. 2. This related art is shown in FIG. 4. In FIG. 4, inductance components or the like existing in the control system are disclosed. Specifically, LP1 indicates an inductance component existing in the electrical conduction path from the P terminal to the collector of the first upper arm switch SH1 via the high voltage side conduction member Bp, and LP2 indicates an inductance component existing in the electrical conduction path from the P terminal to the collector of the second upper arm switch SH2 via the high voltage side conduction member Bp. LO1 indicates an inductance component existing in the electrical conduction path from the emitter of the first upper arm switch SH1 and collector of the first lower arm switch SL1 to the O terminal. Lot indicates an inductance component existing in the electrical path from the emitter of the second upper arm switch SH2 and collector of the second lower arm switch SL2 to the O terminal. LN1 indicates an inductance component existing in the electrical conduction path from the N terminal to the emitter of the first lower arm switch SL1 via the low voltage side conduction member Bn. LN2 indicates an inductance component existing in the electrical conduction path from the N terminal to the emitter of the second lower arm switch SL2 via the low voltage side conduction member Bn.

Also, in the drive circuits DrH and DrL of the arm portions 20H and 20L, L1 indicates a bead inductor and inductance component of the first gate terminal G1. L3 indicates a bead inductor and inductance component of the second gate terminal G2. L5 and L7 indicate inductance components of the first and second emitter terminals KE1 and KE2 respectively. Rb indicates a balancing resistor.

Further, L2 and L4 indicate inductance component existing in an electrical conduction path that connects the gate of the switch and the first and second gate terminals G1 and G2. L6 and L8 indicate inductance components existing in an electrical conduction path that connects the emitter of the switch and the first and second emitter terminals KE1 and KE2.

FIG. 4 is an example showing a state where the upper arm switches SH1 and SH2 included in the upper arm portion 20H are ON for one phase among three phases of the inverter, and the lower arm switches SL1 and SL2 included in the lower arm portion 20L are OFF. According to the example shown in FIG. 4, current flows from the P terminal to the N terminal via the first upper arm switch SH1, the O terminal, two-phase windings 21A included in the motor generator 21, and the lower arm portion 20L of another phase which is not shown. Also, in the example shown in FIG. 4, current flows from the P terminal to the N terminal via the second upper arm switch Sh2, the O terminal, the two-windings 21A and the lower arm portion 20L of another phase which is not shown.

Figure 5:
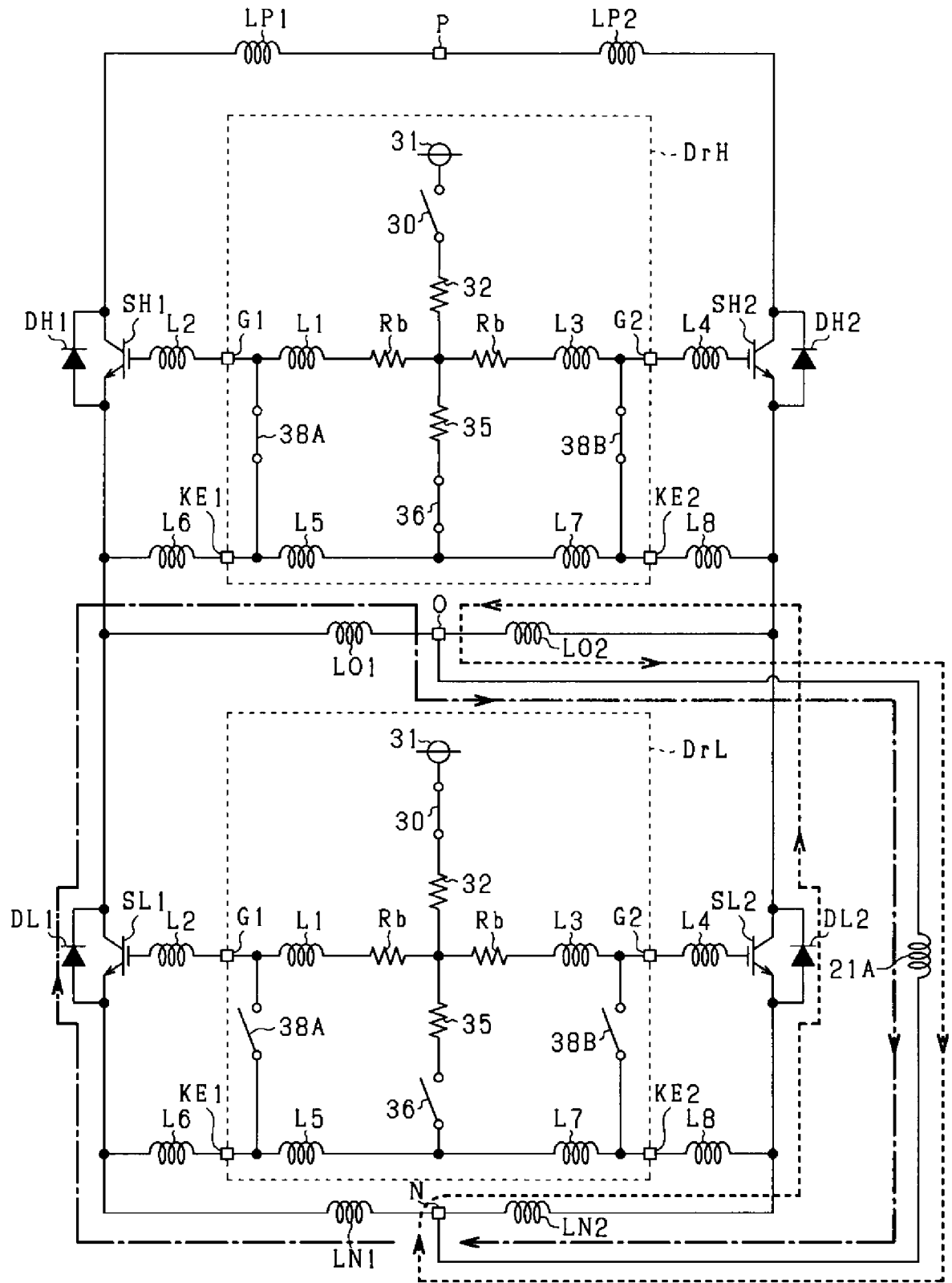
FIG. 5 is a diagram showing a mode of occurrence of LC resonance according to related art.

In FIG. 5, an example is shown in which the upper arm switches SH1 and SH2 included in the upper arm portion 20H are switched to the OFF state, and the lower arm switches SL1 and SL2 included in the lower arm portion 20L are switched to the ON state. In the example shown in FIG. 5, because the winding 21A as an inductive load is present, current continuously flows through the loop path including the first lower arm diode DL1, the O terminal, the winding 21A and the lower arm portion 20L of another phase which is not shown. Also, in the example shown in FIG. 5, current continuously flows through a loop path including the second lower arm diode DL2, the O terminal, the winding 21A and the lower arm portion 20L of another phase which is not shown.

Figure 6:
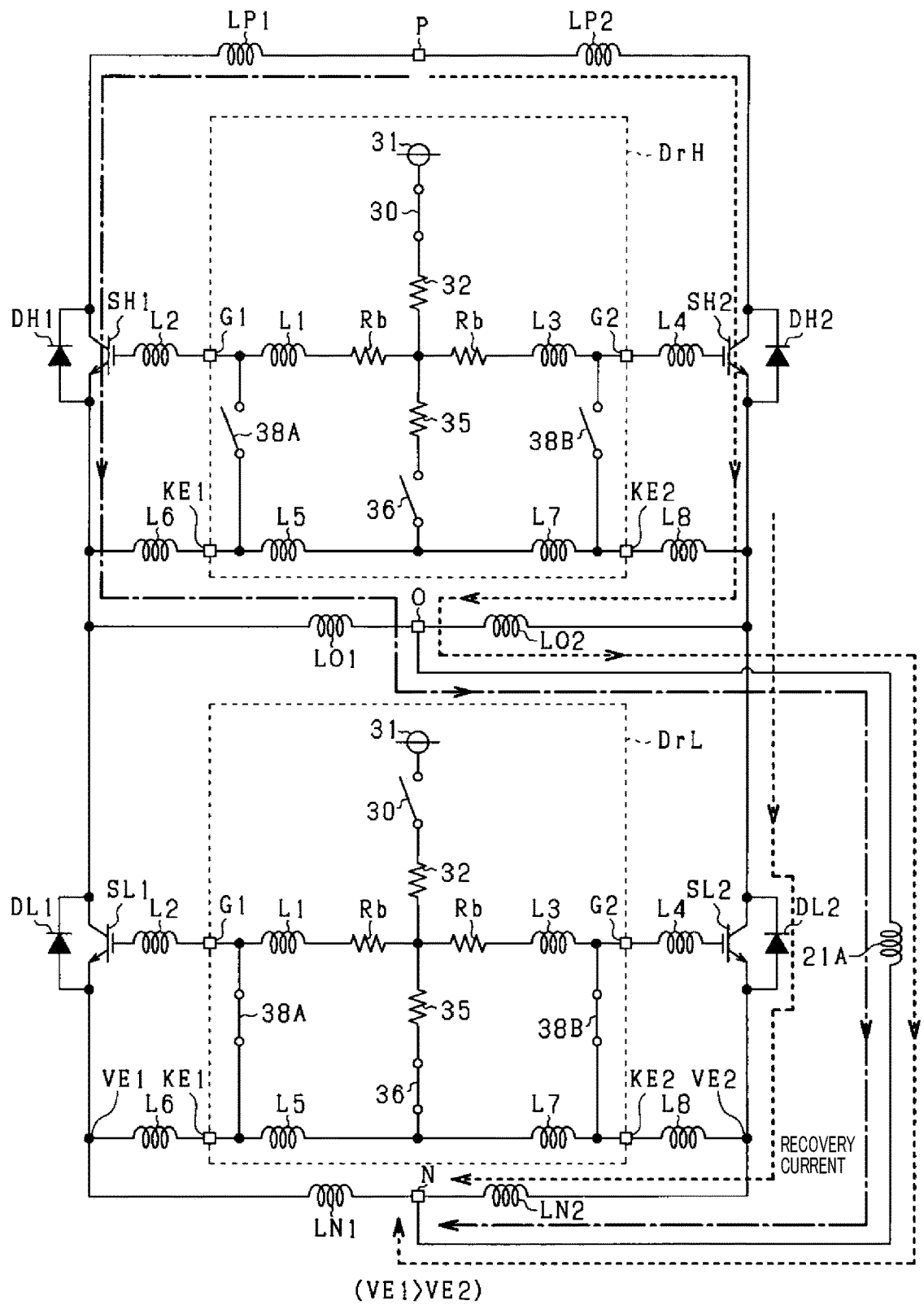
FIG. 6 is a diagram showing a mode of occurrence of LC resonance according to related art.

In FIG. 6, an example is shown in which the upper arm switches SH1 and Sh2 included in the upper arm portion 20H are turned ON again, and the lower arm switches SL1 and SL2 included in the lower arm portion 20L are turned OFF again. According to the example shown in FIG. 6, because reverse voltage is applied to the second lower arm diode DL2, a recovery current flows through the second lower arm diode DL2. Then, since the recovery current stops flowing through the recovery diode, surge voltage occurs in the low voltage side conduction member Bn. The amount of this surge voltage varies being proportional to a product of a decrease rate of the recovery current dI/dT and the inductance L of the low voltage side conduction member Bn. In response to occurrence of the surge voltage, the emitter voltage VE2 of the second lower arm switch SL2 becomes relatively lower than the emitter voltage VE1 of the first lower arm switch SL1.

Figure 7:
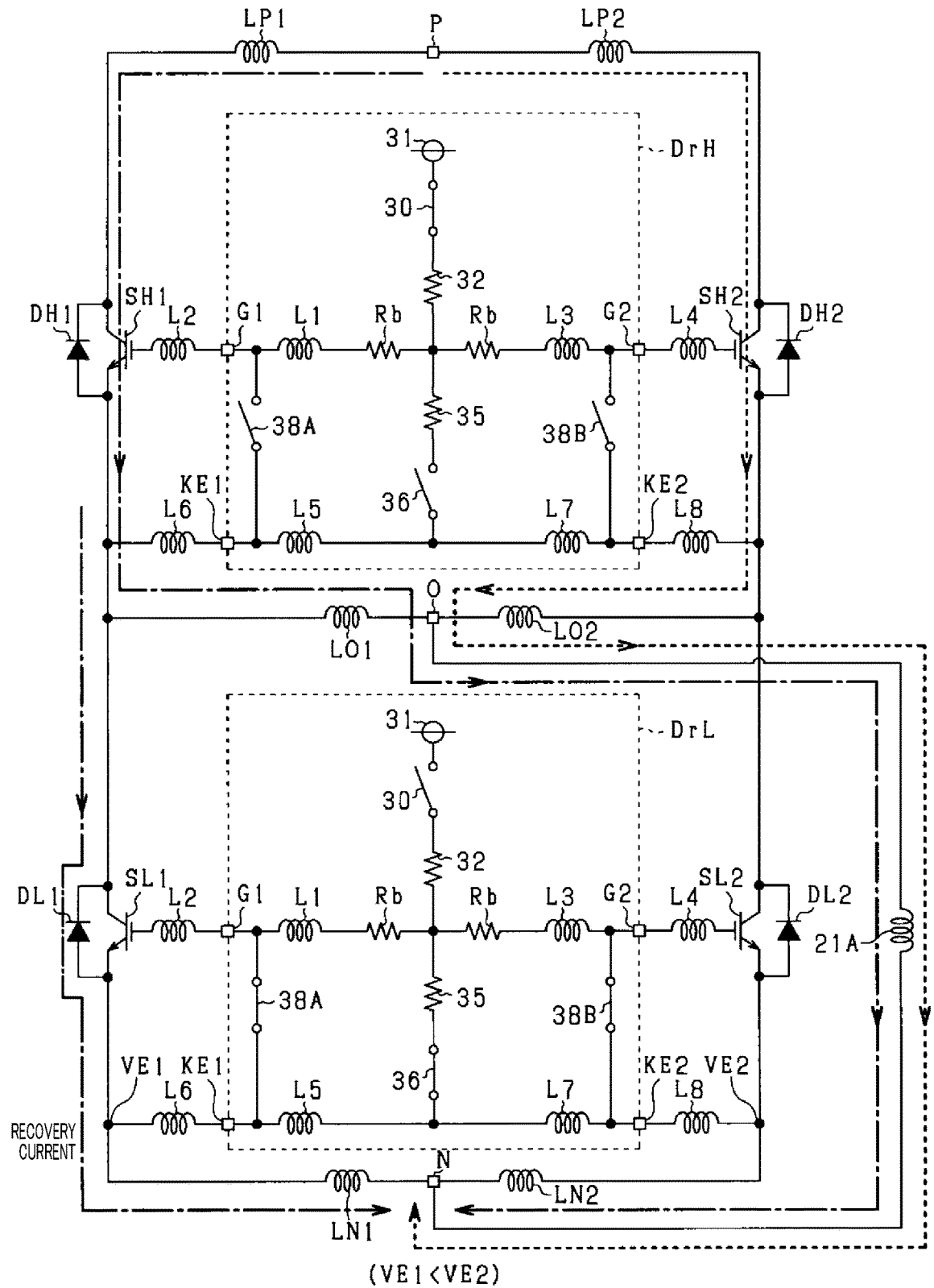
FIG. 7 is a diagram showing a mode of occurrence of LC resonance according to related art.

Then, as shown in FIG. 7, since the reverse voltage is applied to the first lower arm diode DL1, recovery current flows through the first lower arm diode DL1. Then, since the recovery current stops flowing through the recovery diode, surge voltage occurs in the low voltage side conduction member Bn. Hence, in response to occurrence of the surge voltage, the emitter voltage VE1 of the first lower arm switch SL1 becomes lower than the emitter voltage VE2 of the second lower arm switch SL2.

Figure 8:
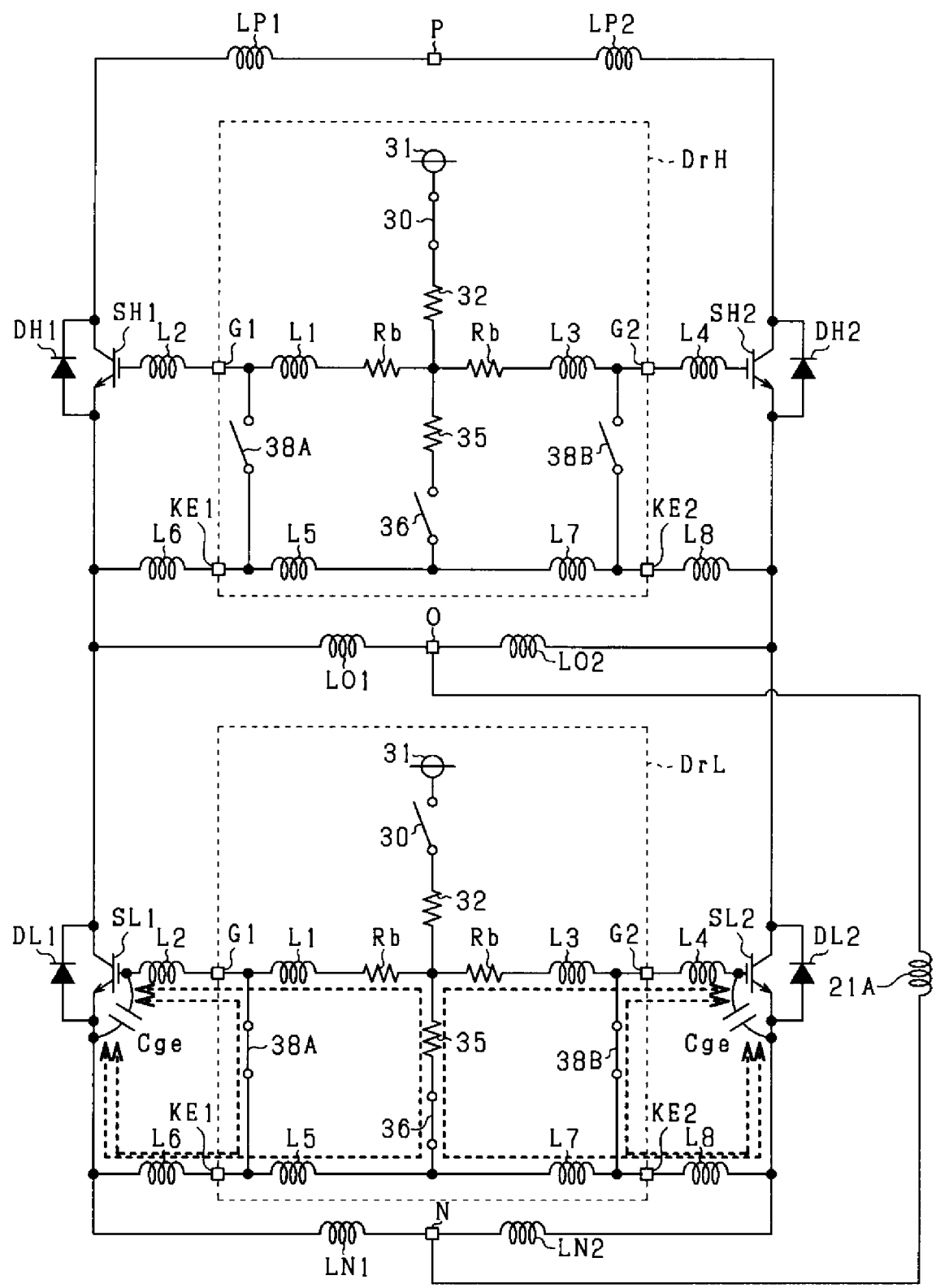
FIG. 8 is a diagram showing a mode of occurrence of LC resonance according to related art.

Thus, since the voltage difference occurs on the emitter voltages between the lower arm switches SL1 and SL2, as shown in FIG. 8, LC resonance occurs on a loop path including gate-emitter capacitance Cge of the lower arm switches SL1 and SL2. In FIG. 8, an example of the loop path is shown by dotted lines with arrows.

When LC resonance occurs, the applied voltage at the gate terminals G1 and G2, the emitter terminals KE1 and KE2 and sense terminals SE1 and SE2 exceeds the rating thereof. Accordingly, problems arise that malfunction of lower arm switches SL1 and SL2 may be caused, or detection accuracy of the sense voltages may decrease. To solve the problems, switching speed of the arm switches may be lowered. However, switching loss may increase so that fuel efficiency will be degraded.

Even in the case where the lower arm switches SL1 and SL2 turn to ON and the upper arm switches SH1 and SH2 turn to OFF, similar to that of the lower arm portion 20L, LC resonance occurs in the upper arm portion 20H.

Figure 9:
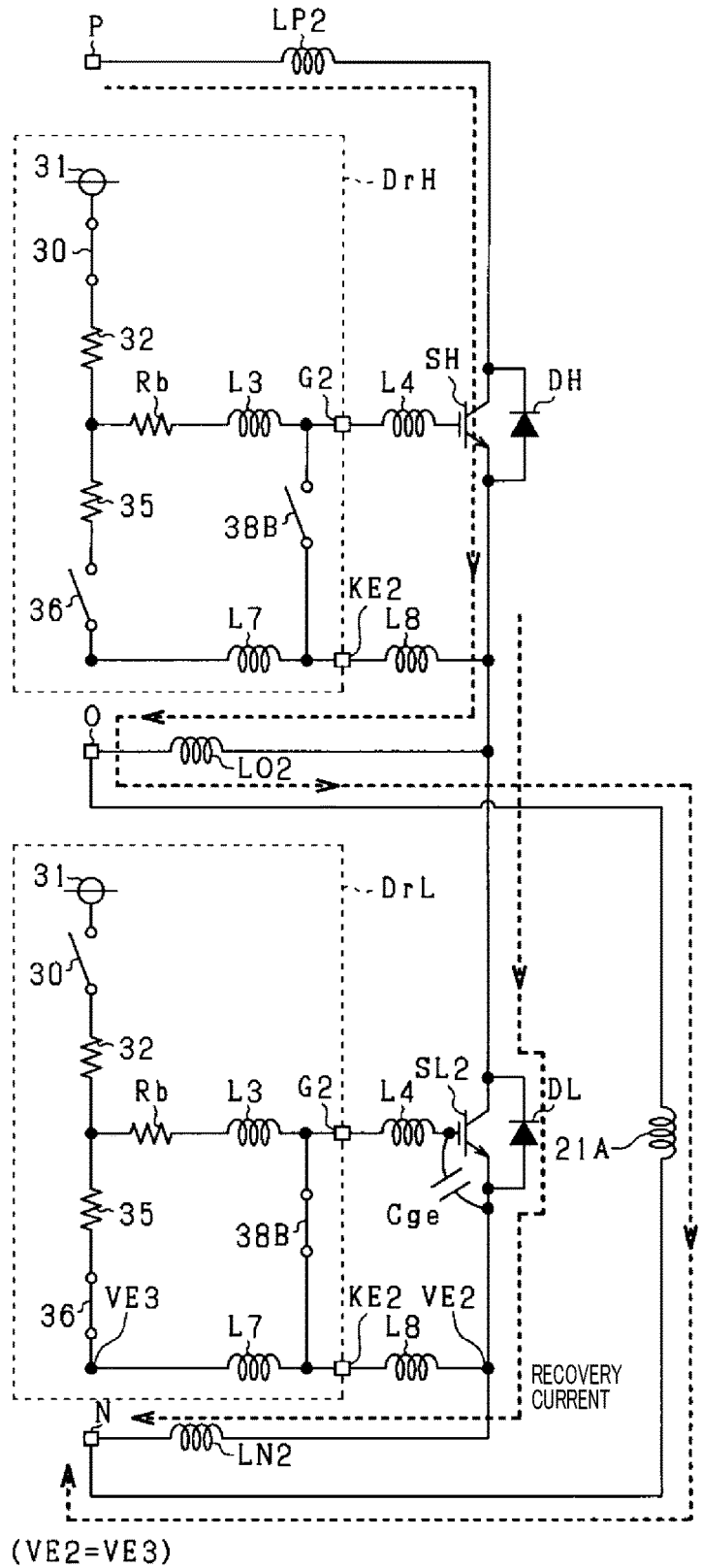
FIG. 9 is a diagram showing a drive circuit according to related art.

With reference to the configuration shown in FIG. 4, an example configuration where arm portions 20H and 20L are configured of one arm switch is shown in FIG. 9. In this case, even when surge voltage occurs when the recovery current stops flowing, LC resonance does not occur. This is because, even if surge voltage occurs, no voltage difference occurs between the emitter voltage VE2 of the second lower arm switch SL2 and the source side voltage VE3 of the discharge switch 36.

To reduce LC resonance, according to the first embodiment, as shown in FIG. 2, diodes 33A, 33B, 34A and 34B are provided. Thus, LC resonance is prevented from occurring in the charging side loop path and the discharging side loop path. It should be noted that the charging side loop paths are described in the following (C1) to (C3).

(C1) The first charging side loop path including a first capacitance between the gate and the emitter of the first arm switch SL1, the gate of the first lower arm switch SL1, the first gate terminal G1, the first connection point T1, the second gate terminal G2, the gate of the second lower arm switch SL2, the second capacitance between the gate and the emitter of the second lower arm switch SL2, the second emitter terminal KE2, the first emitter terminal KE1 and the emitter of the first lower arm switch SL1.

(C2) The second charging side loop path including the gate of the first lower arm switch SL1, the first gate terminal G1, the first connection point T1, object element, the first emitter terminal KE1, and the emitter of the first lower arm switch SL1. The object element is either one of the first OFF holding switch 38A, the discharge resistor 35, and the second OFF holding switch 38B.

(C3) The third charging side loop path including the second capacitance, the gate of the second lower arm switch SL2, the second gate terminal G2, the first connection point T1, object element, the second emitter terminal KE2 and the emitter of the second lower arm switch SL2.

Since the first to third charging side loop paths each includes the first charging side diode 33A or the second charging side diode 33B, direction of the current flowing through respective charging side loop paths can be limited to one direction. As a result, LC resonance in respective charging side loop paths can be reduced.

The discharging side loop paths are described as the following (D1) to (D3).

(D1) The first discharging side loop path including the first capacitance, the gate of the first lower arm switch SL1, the first gate terminal G1, object element, the first emitter terminal KE1, and the first lower arm switch SL1. Since the first discharging side diode 34A is provided in the first discharging side loop path, direction of the current flowing through the loop path can be limited to one direction. As a result, LC resonance in the first discharging side loop path can be reduced.

(D2) The second discharging side loop path including the first capacitance, the gate of the first lower arm switch SL1, the first gate terminal G1, the second connection point T2, the second gate terminal G2, the gate of the second lower arm switch SL2, the second capacitance, the emitter of the second lower arm switch SL2, the second emitter terminal KE2, the first emitter terminal KE1 and the emitter of the first lower arm switch SL1. Since the first discharging side diode 34A or the second discharging side diode 34B is provided in the second discharging loop path, LC resonance in the second discharging side loop path can be reduced.

(D3) The third discharging side loop path including the second capacitance, the gate of the second lower arm switch SL2, the second gate terminal G2, object element, the second emitter terminal KE2, and the emitter of the second lower arm switch SL2. Since the third discharging side loop path include the second discharging side diode 34B, LC resonance in the third discharging side loop path can be reduced.

Thus, according to the first embodiment, even if there are differences in the completion timing of the recovery current flowing through the respective arm diodes included in the arm portions, LC resonance can be reduced.

The drive circuit DrL is provided with the above-describe soft cutoff path. The soft cutoff path does not constitute a loop path that causes LC resonance. Hereinafter, as an example, the lower arm portion 20L will be described.

In the case where the lower arm switches SL1 and SL2 are ON state, if the over current flows through the lower arm switches SL1 and SL2, the soft cut off switch turns ON. LC resonance occurs when the lower arm switches SL1 and SL2 are in an OFF state. When the lower arm switches SL1 and SL2 are OFF, the soft cutoff switch is in the OFF state. Therefore, a loop path having the gate-emitter capacitance and the soft cutoff path is not formed. Accordingly, the soft cutoff path does not form a loop path causing LC resonance.

(Second Embodiment)

Figure 10:
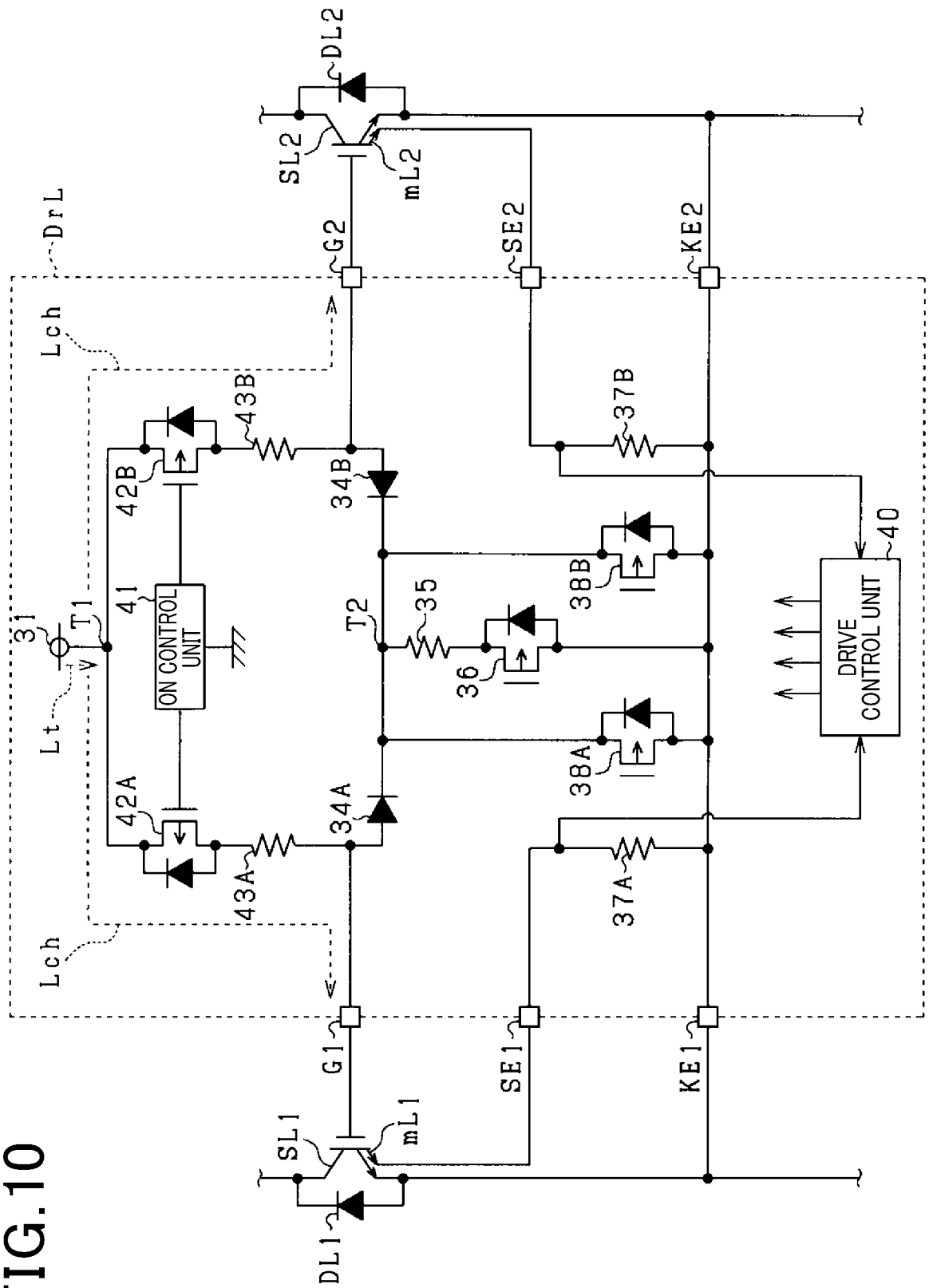
FIG. 10 is a diagram showing a drive circuit according to the second embodiment.

Hereinafter, with reference to the drawings, the second embodiment will be described, in which differences from the first embodiment are mainly described. According to the second embodiment, as shown in FIG. 10, the charging side elements are changed to switches instead of the diodes. In FIG. 10, the same reference numbers are applied to the same configurations shown in FIG. 2.

As shown in FIG. 10, at the constant voltage source 31, the first connection point T1 is connected. According to the second embodiment, an electrical conduction path from the constant voltage source 31 to the first connection point T1 corresponds to power path Lt.

The drive circuit DrL is provided with the first charge switch 42A and the second charge switch 42B. According to the second embodiment, the charge switches 42A and 42B are configured of P channel MOSFETs. At the source of the first charge switch 42A, the first connection point T is connected, and at the drain of the first charge switch 42A, the first end of the first charge resistor 43A is connected. At the second end of the first charge resistor 43A, the first gate terminal G1 is connected. Also, at the source of the second charge switch 42B, the first connection point T1 is connected, and at the drain of the second charge switch 42B, the first end of the second charge resistor 43B is connected. At the second end of the second charge resistor 43B, the second gate terminal G2 is connected.

According to the second embodiment, an electrical conduction path from the first connection point T1 to the first gate terminal G1 via the first charge switch 42A and the first charge switch resistor 43A, and an electrical conduction path from the first connection point T1 to the second gate terminal G2 via the second charge switch 42B and the second charge resistor 43B correspond to branch path Lch.

According to the second embodiment, as a charge processing, the drive control unit 40 turns the charge switches 42A and 42B ON and turns the discharge switch 36 OFF, when determining that the drive signal indicates the ON drive command. The charge switches 42A and 42B are driven by which the drive control unit 40 controls the ON controlling unit 41.

On the other hand, the drive control unit 40 turns the charge switches 42A and 42B OFF and turns the discharge switch 36 ON when determining that the drive signal indicates an OFF drive signal.

According to the first charge switch 42A and the second charge switch 42B, LC resonance in the first to third charging side loop paths described in (C1) to (C3) of the first embodiment can be reduced. In other words, describing the lower arm portion 20L as an example, when the arm switch that constitutes the upper arm portion 20H as a counter arm portion turns ON, LC resonance occurs in the lower arm portion 20L which is the subject arm portion. In this case, since the first charge switch 42A and the second charge switch 42B are in OFF states, the charge switches 42A and 42B cutoff the charging side loop path.

The first charge switch 42A and the second charge switch 42B have smaller on-resistance than diodes. Therefore, according to the second embodiment, the configuration of reducing LC resonance minimizes an influence to respective arm switches.

(Third Embodiment)

Figure 11:
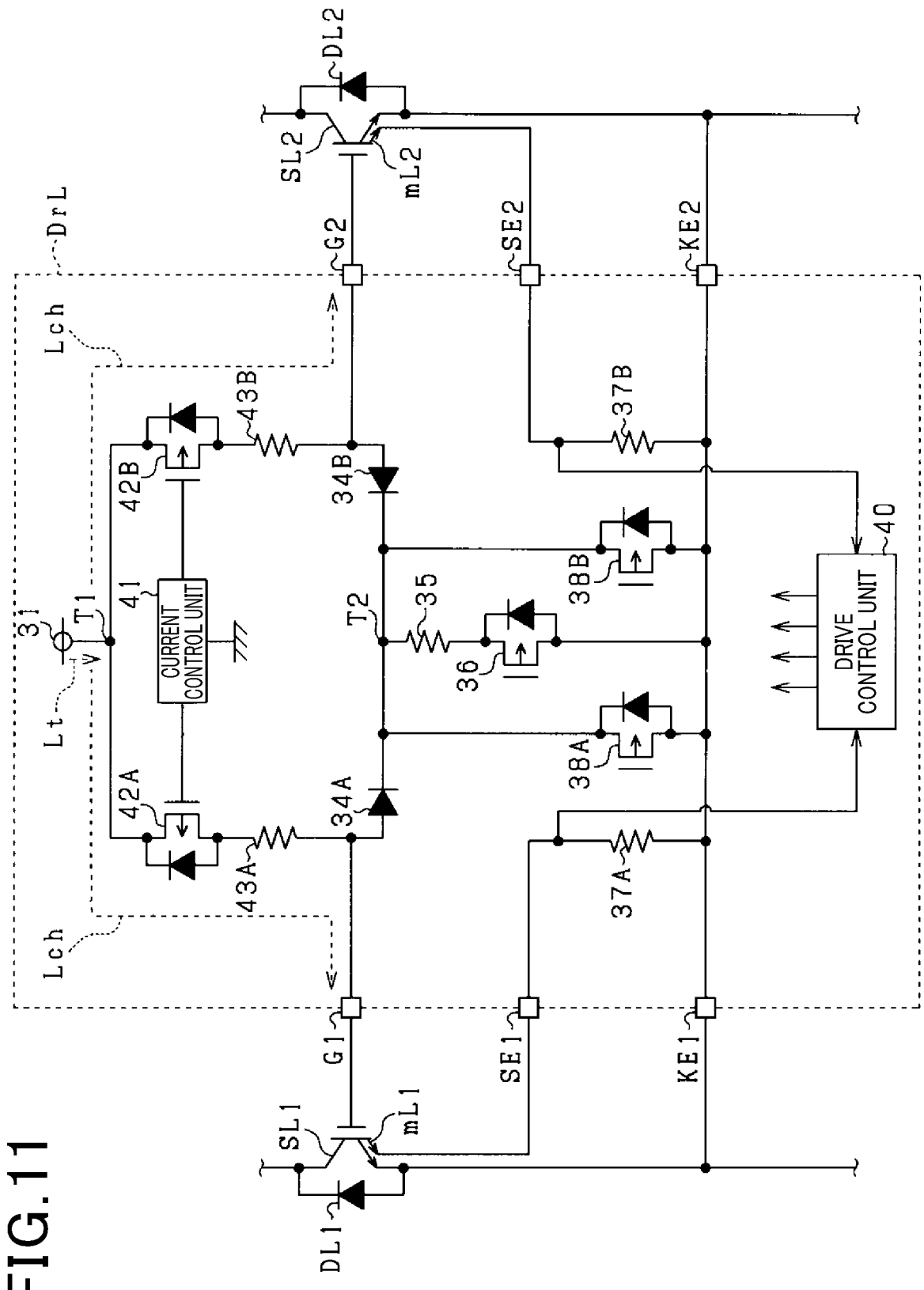
FIG. 11 is a diagram showing a drive circuit according to the third embodiment.

Hereinafter, with reference to the drawings, the third embodiment will be described, in which differences from the first embodiment are mainly described. According to the third embodiment, as shown in FIG. 11, gate charge current is supplied by constant current driving instead of constant voltage driving. In FIG. 11, the same reference numbers are applied to the same configurations shown in FIG. 2.

As shown in the drawing, the drive circuit DrL is provided with the first charge switch 44A and the second charge switch 44B. According to the third embodiment, the charge switches 44A and 44B are configured of P channel MOSFET. At the source of the first charge switch 44A, the first connection point T1 is connected, and at the drain of the first charge switch 44A, the first gate terminal G1 is connected. Also, at the source of the second charge switch 44B, the first connection point T1 is connected, and at the drain of the second charge switch 44B, the second gate terminal G2 is connected. The potential difference across the charge resistor 32 enters the current control unit 45 which is provided with the drive circuit DrL.

According to the third embodiment, an electrical conduction path from the first connection point T1 to the first gate terminal G1 via the first charge switch 44A, and an electrical conduction path from the first connection point T1 to the second gate terminal G2 via the second charge switch 44B correspond to branch path Lch.

In the third embodiment, as a charging process, the drive control unit 40 outputs an enable signal to the current control unit 45 so as to turn the discharge switch 36 OFF, when determining that the ON drive command as the drive signal is accepted. On the other hand, as the discharging process, the drive control unit 40 does not output the enable signal to the current control unit 45 and turns the discharge switch 36 ON, when determining that the drive signal indicates the OFF drive command.

The current control unit 45 accepts the enable signal, whereby the electrical potential at the first connection point T1 can be maintained at the target value. Hence, a constant current drive can be performed to control the gate charge current to be constant.

According to the first charge switch 44A and the second charge switch 44B, LC resonance in the first to third charging side loop paths described in (C1) to (C3) of the above-described first embodiment can be reduced. The reason for this is the same as the reason described in the above-described second embodiment.

(Fourth Embodiment)

Figure 12:
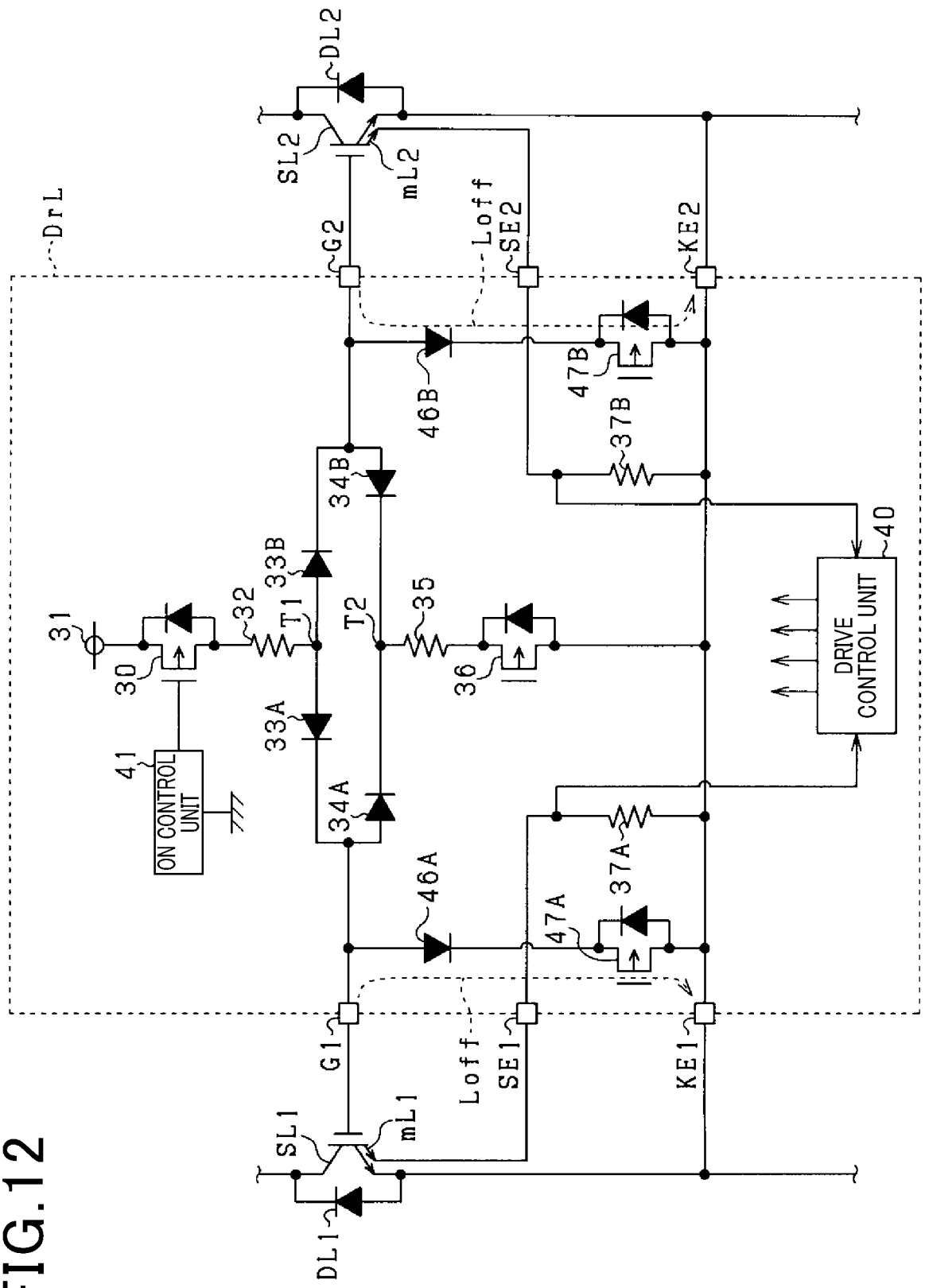
FIG. 12 is a diagram showing a drive circuit according to the fourth embodiment.

Hereinafter, with reference to the drawings, the fourth embodiment will be described, in which differences from the first embodiment are mainly described. According to the fourth embodiment, as shown in FIG. 12, the arrangement of an OFF holding path is changed. In FIG. 12, the same reference numbers are applied to the same configurations shown in FIG. 2.

As shown in FIG. 12, the anode of the first OFF side diode 46A is connected to an electrical path from the first gate G1 to the anode of the first discharging side diode 34A, or to the first gate terminal G1. Also, the anode of the second OFF side diode 46B is connected to an electrical path from the second gate G2 to the anode of the second discharging side diode 34B, or to the second gate terminal G2.

The drive circuit DrL is provided with a first OFF holding switch 47A and a second OFF holding switch 47A. According to the fourth embodiment, the OFF holding switches 47A and 47B are configured of N channel MOSFETs. At the drain of the first OFF holding switch 47A, the cathode of the first OFF side diode 46A is connected. At the source of the first OFF holding switch 47A, a short-circuit path that short-circuits the first emitter terminal KE1 and the second emitter terminal KE2. At the drain of the second OFF holding switch 47B, the cathode of the second OFF side diode 46B is connected. At the source of the second OFF holding switch 47B, the above-described short-circuit path is connected.

According to the fourth embodiment, an electrical conduction path from the first gate terminal G1 to the first emitter terminal KE1 via the first OFF side diode 46A and the first OFF holding switch 47A, and an electrical conduction path from the second gate terminal G2 to the second emitter terminal KE2 via the second OFF side diode 46B and the second OFF side holding switch 47B correspond to OFF holding path Loff.

According to the fourth embodiment, the drive circuit DrL is provided with the above-described OFF holding path Loff. Hence, a discharging loop path is formed as described in the following (D4) to (D7).

(D4) Fourth discharge side loop path including the first capacitance, the gate of the first lower arm switch SL1, the first gate terminal G1, the first OFF holding switch 47A, the first emitter terminal KE1, and the emitter of the first lower arm switch SL1.

(D5) Fifth discharging side loop path including the first capacitance, the gate of first lower arm switch SL1, the first gate terminal G1, the second terminal point T2, the second OFF holding switch 47B, the first emitter terminal KE1, and the emitter of the first lower arm switch SL1.

(D6) Sixth discharging side loop path including the second capacitance, the gate of the second lower arm switch SL2, the second gate terminal G2, the second OFF holding switch 47B, the second emitter terminal KE2, and the emitter of the second lower arm switch SL2.

(D7) Seventh discharging side loop path including the second capacitance, the gate of the second lower arm switch SL2, the second gate terminal G2, the second connection point T2, the first OFF holding switch 47A, the second emitter terminal KE2, and the emitter of the second lower arm switch SL2.

According to the first OFF side diode 46A, LC resonance in the fourth and seventh discharging side loop paths can be reduced. Further, according to the second OFF side diode 46B, LC resonance in the fifth and sixth discharging side loop path can be reduced.

According to the fourth embodiment, when the discharge switch 36 is ON, all of the lower arm switches SL1 and SL2 are switched OFF. Other than this, for example, when turning only the first OFF holding switch 47A ON among the switches 36, 47A and 47B, only the first lower arm switch SL1 can be switched to OFF state among the lower arm switches SL1 and SL2.

(Fifth Embodiment)

Figure 13:
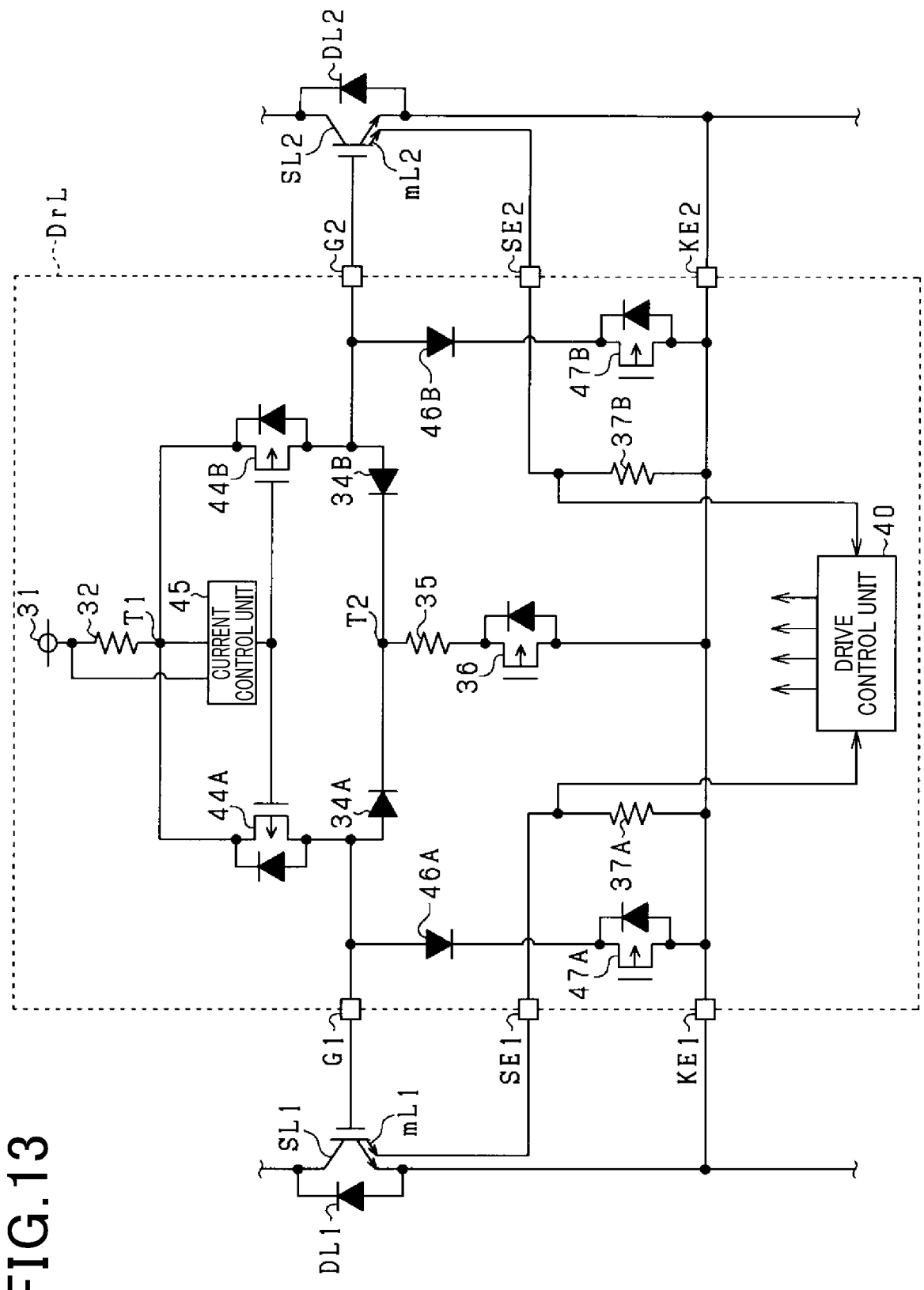
FIG. 13 is a diagram showing a drive circuit according to the fifth embodiment.

Hereinafter, with reference to the drawings, the fifth embodiment will be described, in which differences from the fourth embodiment are mainly described. According to the fifth embodiment, as shown in FIG. 13, configuration for charging side is changed. Specifically, the configuration for the constant voltage driving shown in FIG. 12 is changed to the configuration of the constant current driving shown in FIG. 11. In FIG. 13, the same reference numbers are applied to the same configurations shown in FIGS. 11 and 12.

According to the fifth embodiment, the same effects and advantages as the fourth embodiment can be obtained.

(Sixth Embodiment)

Figure 14:
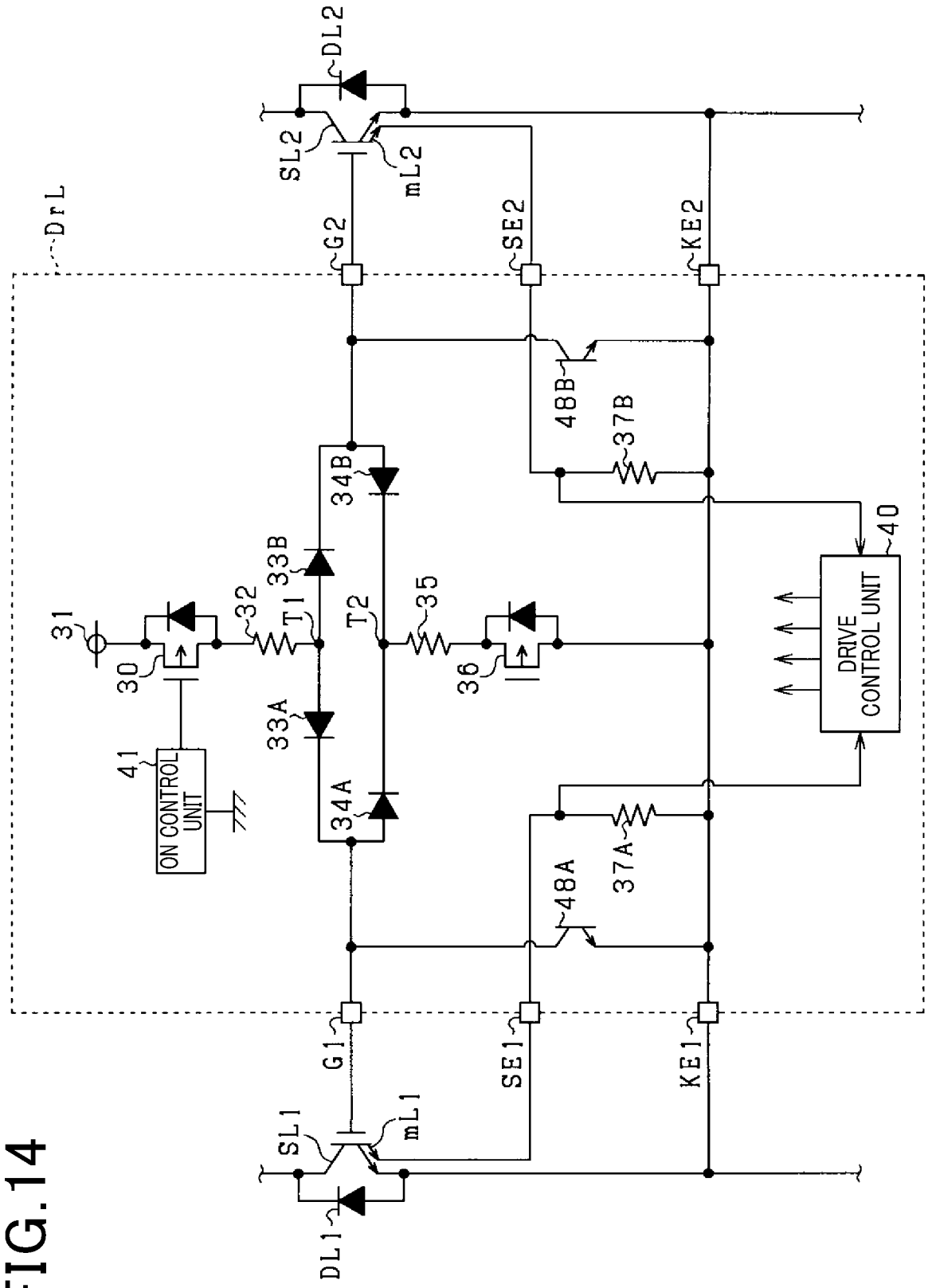
FIG. 14 is a diagram showing a drive circuit according to the sixth embodiment.

Hereinafter, with reference to the drawings, the sixth embodiment will be described, in which differences from the fourth embodiment are mainly described. According to the sixth embodiment, as shown in FIG. 14, the OFF holding switch is changed to a bipolar transistor from the MOSFET. In FIG. 14, the same reference numbers are applied to the same configurations shown in FIG. 12.

As shown in FIG. 14, the drive circuit DrL is provided with the first OFF holding switch 48A and the second holding switch 48B. According to the sixth embodiment, for the OFF holding switches 48A and 48B, npn transistors are used.

At the collector of the first OFF holding switch 48A, the first gate terminal G1 is connected, and at the emitter of the first holding switch 48A, a short-circuit path that short-circuits the first emitter terminal KE1 and the second emitter terminal KE2. At the collector of the second OFF holding switch 48B, the second gate terminal G2 is connected, and at the emitter of the second holding switch 48B, the above-described short-circuit path is connected.

Describing the first OFF holding switch 48A as an example, the first OFF holding switch 48A disconnects between the first gate terminal G1 and the short-circuit path, when being OFF. On the other hand, the first holding switch 48A, when being ON, allows current flowing in a direction to the short-circuit path from the first fate terminal G1 in the OFF holding path Loff, and cutoff current flowing in the reverse direction.

Accordingly, the MOSFET and the diode in the OFF holding path Loff can be replaced by bipolar transistors. Therefore, according to the sixth embodiment, the number of components in the OFF holding path Loff can be more reduced than in the fourth embodiment.

(Seventh Embodiment)

Figure 15:
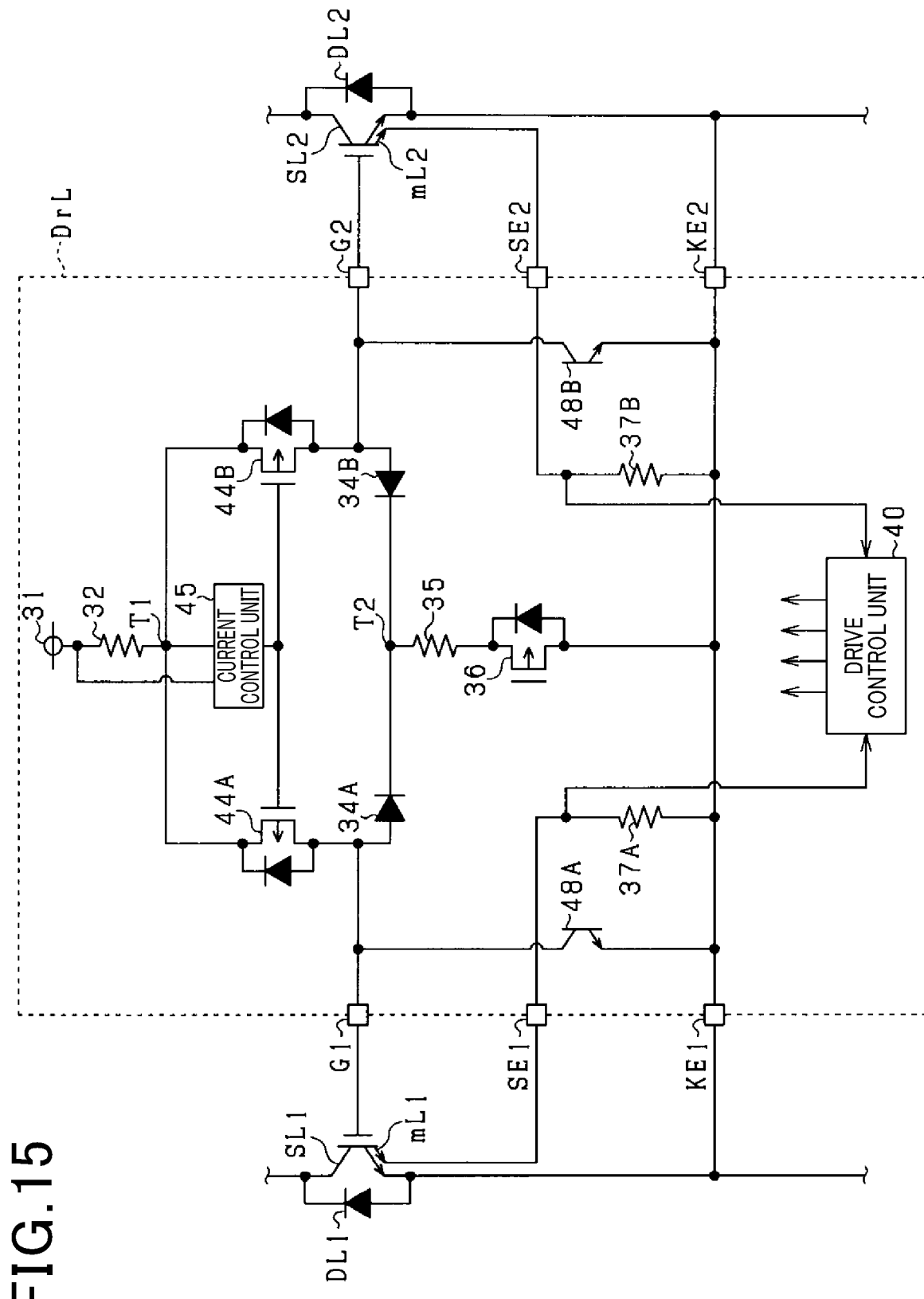
FIG. 15 is a diagram showing a drive circuit according to the seventh embodiment.

Hereinafter, with reference to the drawings, the seventh embodiment will be described, in which differences from the sixth embodiment are mainly described. According to the seventh embodiment, as shown in FIG. 15, a configuration of the charging side circuit is changed. In FIG. 15, the same reference numbers are applied to the same configurations shown in FIGS. 11 and 14.

According to the seventh embodiment, the same effects and advantages as the sixth embodiment can be obtained.

(Eighth Embodiment)

Figure 16:
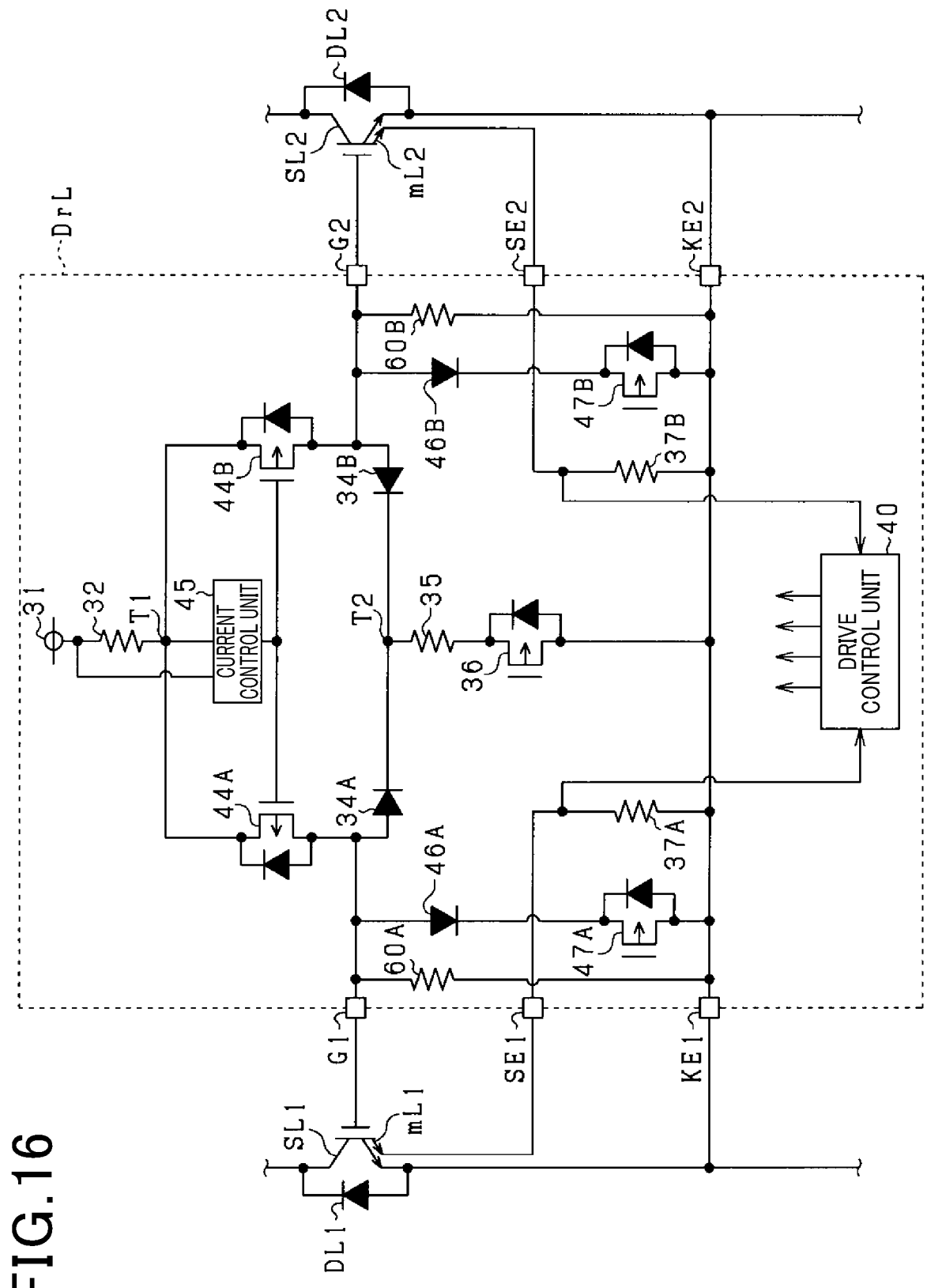
FIG. 16 is a diagram showing a drive circuit according to the eighth embodiment.

Hereinafter, with reference to the drawings, the eighth embodiment will be described, in which differences from the fifth embodiment are mainly described. According to the eighth embodiment, as shown in FIG. 16, a configuration of the charging side circuit is changed. In FIG. 16, the same reference numbers are applied to the same configurations shown in FIG. 13.

As shown in FIG. 16, at the first gate terminal G1, the first end of the first resistor 60A is connected, and at the second end of the first resistor 60A, a short-circuit path that short-circuits the first emitter terminal KE1 and the second emitter terminal KE2 is connected. The first resistor 60A is provided for withdrawing negative charge from the gate of the lower arm switch SL1. Specifically, in the case where the electric potential of the first lower arm switch SL1 varies due to some reason, positive charge moves from the gate of the first lower arm switch SL1 to the emitter via the first capacitance. In this case, the gate potential of the first lower arm switch SL1 becomes lower than the emitter potential of the first lower arm switch SL1. In other words, negative charge is accumulated in the gate. However, since the first OFF side diode 46A is provided in the discharge path, negative charge cannot be withdrawn. Accordingly, to withdraw the negative charge, the first resistor 60A is provided.

At the second gate terminal G2, the first end of the second resistor 60B is connected, and at the second end of the second resistor 60B, a short-circuit path that short-circuits the first emitter terminal KE1 and the second emitter terminal KE2 is connected. The second resistor 60B is used for withdrawing the negative charge from the gate of the second lower arm switch SL2.

According to the eighth embodiment, the drive circuit DrL is provided with the above-described first resistor 60A and the second resistor 60B. Thus, discharging side loop paths are formed as described in the following (D8) to (D11).

(D8) An eighth discharging side loop path including the first capacitance, the gate of the first lower arm switch SL1, the first gate terminal G1, the first resistor 60A, the first emitter terminal KE1, and the emitter of the first lower arm switch SL1.

(D9) Ninth discharging side loop path including the first capacitance, the gate of the first lower arm switch SL1, the first gate terminal G1, the second connection point T2, the second resistor 60B, the first emitter terminal KE1, and the emitter of the first lower arm switch SL1.

(D10) Tenth discharging side loop path including the second capacitance, the gate of the second lower arm switch SL2, the second gate terminal G2, the second resistor 60B, the second emitter terminal KE2, and the emitter of the second lower arm switch SL2.

(D11) Eleventh discharging side loop path including the second capacitance, the gate of the second lower arm switch SL2, the second gate terminal G2, the second connection point T2, the first resistor 60A, the second emitter terminal KE2, and the emitter of the second lower arm switch arm switch SL2.

The resistance Ra (e.g., 100 ohm or higher) of the first resistor 60A and the resistor 60B is set to be larger than the resistance Rb of the charge path including the charge resistor 32, and the resistance Rc of the discharge path including the discharge resistor 35, the first OFF holding switch 47A or the second OFF holding switch 47B. Specifically, the value is set to be 10 to 100 times the resistance Rb, and Rc. Therefore, impedance of the eighth to eleventh discharging side loop paths are sufficiently higher than the impedance of the fourth to seventh discharging side loop paths described in (C4) to (C7), for example. Thus, the eighth to eleventh discharging side loop paths have large attenuation. Therefore, the eighth to eleventh discharging side loop paths may serve as resonance paths, but reduce LC resonance because of their large attenuation.

(Ninth Embodiment)

Figure 17:
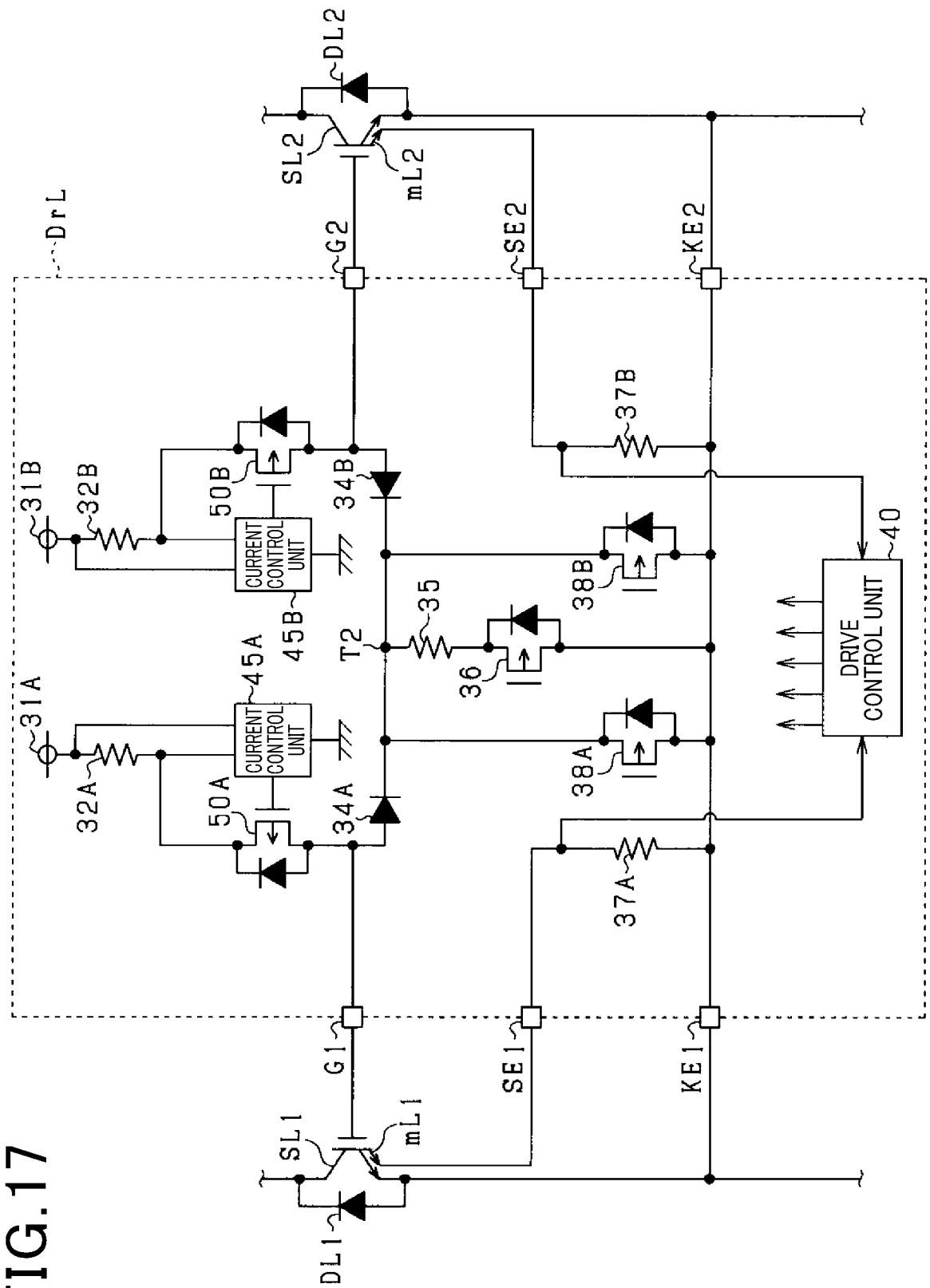
FIG. 17 is a diagram showing a drive circuit according to the ninth embodiment.

Hereinafter, with reference to the drawings, the ninth embodiment will be described, in which differences from the third embodiment are mainly described. According to the ninth embodiment, as shown in FIG. 17, a configuration of the charging side circuit is changed. In FIG. 17, the same reference numbers are applied to the same configurations shown in FIG. 11.

As shown in FIG. 17, at the first constant voltage source 31A, the first end of the first charge resistor 32A is connected. At the second constant voltage source 31B, the first end of the second charge resistor 32B is connected.

The drive circuit DrL is provide with a second charge switch 50A and the second charge switch 50B. According to the ninth embodiment, P channel MOS FETs are used for the charge switches 50A and 50B. At the source of the first charge switch 50A, the second end of the first charge resistor 32A is connected. At the drain of the first charge switch 50A, the first gate terminal G1 is connected. At the source of the second charge switch 50B, the second end of the second charge resistor 32B is connected. At the drain of the second charge switch 50B, the second gate terminal G2 is connected. The voltage difference across the first charge resistor 32A enters the first current control unit 45A included in the drive circuit DrL. The voltage difference of the second charge resistor 32B enters the second current control unit 45B included in the drive circuit DrL According to the ninth embodiment, as a charging process, the drive control unit 40 outputs an enable signal to the current control units 45A and 45B, when determining that ON drive signal is being entered as a drive signal, so as to make the discharge switch 36 OFF. Meanwhile, as a discharging process, the drive control unit 40 outputs no enable signal to the current control unit 45A and 45B, when determining that the drive signal indicates OFF drive signal so as to make the discharge switch 36 ON.

The enable signal is supplied to the first and second current control units 45A and 45B thereby driving the first and second charge switches 50A and 50B so as to maintain electrical potential of the second end sides of the first and second charge resistors 32A and 32B to be the target value. As a result, constant current driving can be performed in which the gate charge current supplied to the lower arm switches SL1 and SL2 are constant value.

According to the ninth embodiment described above, switching speeds of the lower arm switches SL1 and SL2 are individually controlled. In other words, conduction paths of the gate charge current are provided individually for the lower switches SL1 and SL2. According to the configuration, the power source path Lt and the branch path Lch corresponding to the lower arm switches SL1 and SL2 are divided. Hence, charging side loop paths are not formed for the respective lower arm switches SL1 and SL2. Accordingly, LC resonance of the charging side loop paths can be avoided.

(Tenth Embodiment)

Figure 18:
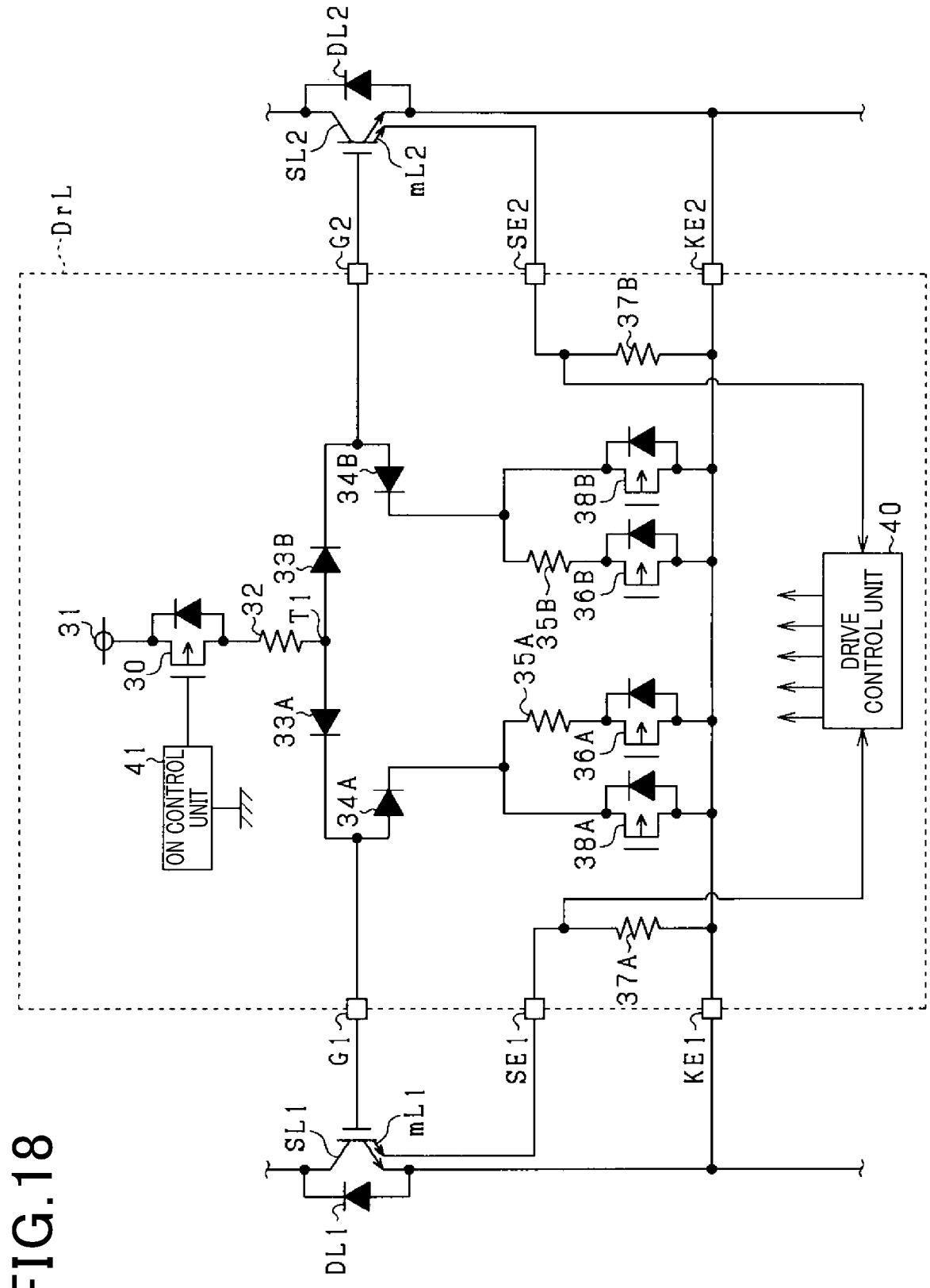
FIG. 18 is a diagram showing a drive circuit according to the tenth embodiment.

Hereinafter, with reference to the drawings, the tenth embodiment will be described, in which differences from the first embodiment are mainly described. According to the tenth embodiment, as shown in FIG. 18, a configuration of the charging side circuit is changed. In FIG. 18, the same reference numbers are applied to the same configurations shown in FIG. 2.

As shown in FIG. 18, at the cathode of the first discharging side diode 34A, the first end of the first discharging resistor 35A is connected. At the cathode of the second discharging side diode 34B, the first end of the second discharge resistor 35B is connected.

The drive circuit DrL is provided with the first discharging side switch 36A and the second discharging switch 36B. According to the tenth embodiment, N channel MOSFETs are used for the discharge switches 36A and 36B. At the drain of the first discharge switch 36A, the second end of the first discharging resistor 35A is connected. At the drain of the second discharge switch 36B, the second end of the second discharge resistor 35B is connected. At the sources of the first discharge switch 36A and the second discharge switch 36B, a short-circuit path that short-circuits the first emitter terminal KE1 and the second emitter terminal KE2 is connected.

As a charging process, the drive control unit 40 turns the charge switch 30 ON, and turns the discharge switches 36A and 36B OFF when the drive signal indicates an ON drive command. On the other hand, as a discharging process, the drive control unit 40 turns the charge switch 30 OFF and turns the discharging switches 36A and 36B.

According to the tenth embodiment, the configuration is different from the configuration illustrated in FIG. 2, and a part of the lower arm switches SL1 and SL2 are not common. Hence, discharge paths corresponding to the lower arm switches SL1 and SL2 are divided. Accordingly, the number of discharge side loop paths decreases from the first embodiment.

(Other Embodiment)

The above-described embodiments may be modified as follows.

In the above-described first embodiment, either first charging side diode 33A or second charging side diode 33B may be removed from the configuration. Even in this case, LC resonance in the first to third charging side loop paths can be reduced.

In the first embodiment, either a pair of first and second charging side diodes 33A and 33B or a pair of first and second discharging side diodes 34A and 34B can be removed. In the case where the first and second charging side diodes 33A and 33B are removed, components which reduce LC resonance are not provided in the first charging side loop path described in the above (C1).

In the first embodiment, position of the first discharging side diode 34A may be changed in the discharge path from the first gate terminal G1 to the first emitter terminal KE1 via the first OFF holding switch 38A.

For example, the first discharging side diode 34A may be disposed in the above-described discharging path to be closer to the first emitter terminal KE1 than the first OFF holding switch 38A. Specifically, the first discharging side diode 34A may be disposed in the short-circuit path that short-circuits the first emitter terminal KE1 and the second emitter terminal KE2 to be closer to the first OFF holding switch 38A side than the connection point of the first sense resistor 37A. In this case, detection accuracy of the first sense voltage can be prevented from being influenced by a voltage drop at the first discharging side diode 34A. It should be noted that the first discharging side diode 34A may be disposed in the above-described short-circuit path to be closer to the first emitter terminal KE1 side than to the second end of the first sense resistor 37A.

The above-described items for the first discharging side diode 34A can be applied to the second discharging side diode 34B.

In the configurations shown in FIGS. 12 and 13, either the first OFF side diode 46A or the second OFF side diode 46B can be removed.

The first and second resistors 60A and 60B shown in FIG. 16 of the above-described eighth embodiment may be provided in the drive circuits in the above-described first to seventh, ninth and tenth embodiments.

The voltage controlled type switch included in the inverter is not limited to IGBT but may be configured of N channel MOSFET. In this case, the output terminal of the switch is defined as the source, and the input terminal of the switch is defined as the drain. In this case, a gate-source capacitance Cgs is formed in the MOSFET. Further, freewheel diode connected in reversely parallel to the switch may be body diode of the MOSFET, or a diode connected in reverse parallel to the MOSFET as an external component.

The number of parallel connected circuits which constitute respective arm portions is not limited to 2, but may be 3 or more. In this case, LC resonance occurs because completion timings of the recovery current flowing through the freewheel diodes are varied, where freewheel diodes are connected in reverse parallel to at least 2 switches.

The number of phases of the inverter is not limited to three phase, but may be 2 phase or 4 phase or more. In other words, a configuration may employed, in which upper and lower arm portions are provided for at least 2 phases, and the O terminal serving as a connection point between the upper arm portion and the lower arm portion is connected to inductive load.

The drive circuit is not limited to one mounted to a vehicle.

What is claimed is:

1. A drive circuit that drives a plurality of voltage controlled switches mutually connected in parallel, in which a flywheel diode is connected in reverse parallel to each of the voltage controlled switches, the drive circuit comprising:

for each voltage controlled switch:
a charge path connected to a gate of the voltage controlled switch, through which gate charge current flows to turn the voltage controlled switch ON;
a discharge path connected to the gate and an output terminal of the voltage controlled switch, through which gate discharge current flows to turn the voltage controlled switch OFF;
an OFF holding path which short-circuits a point closer to a gate side than to a discharging side element and the output terminal;
an OFF holding path element disposed in the OFF holding path, the OFF holding path element allowing current to flow in a predetermined direction from the gate to the output terminal and preventing current from flowing in a direction opposite to the predetermined direction; and the discharging side element disposed on a discharging side loop path having the gate, a part of the discharge path, and the output terminal, the discharging side element restricting a current flow to be in one direction and not disturbing a current flow of discharge current, the discharging side element being disposed on the part of the discharge path from each of the controlled switches to the discharge switch, the discharging side element being configured to allow current to flow in a discharging direction from the gate to the output terminal, and prevent current from flowing in a direction opposite to the discharging direction; and a discharge switch disposed in the discharge path to be closer to an output terminal side than to the discharging side element, the discharge switch being shared by the plurality of voltage controlled switches, wherein the charge path and the discharge path are separately provided to allow the charge current and the discharge current to flow through different paths.

2. The drive circuit according to claim 1, wherein the discharging side element is a discharging side diode with its anode connected to the gate side and its cathode connected to the output terminal side.

3. The drive circuit according to claim 1, wherein
the OFF holding path element is an OFF side diode with its anode connected to the gate side and its cathode connected to the output terminal side, and
a first OFF holding switch is provided in the OFF holding path, the first OFF holding switch turns ON when an OFF drive command is indicated on a corresponding switch.

4. The drive circuit according to claim 1, wherein the OFF holding path element is a second OFF holding switch that electrically disconnects between the gate and the output terminal when being turned OFF, and allows current to flow in the predetermined direction and prevents current from flowing in a direction opposite to the predetermined direction when being turned ON.

5. The drive circuit according to claim 1, wherein
the drive circuit includes a resistor provided for each voltage controlled switch, which connects a point closer to the gate side than to the discharging side element and the output terminal in the discharge path, and
a resistance of the resistor is set to be larger than a resistance of the discharge path.

6. The drive circuit according to claim 1, wherein
a plurality of discharging side loop paths are formed in the drive circuit, and
the discharging side element is provided for each of the discharging side loop paths.

7. The drive circuit according to claim 1, wherein
the drive circuit includes the discharging side element disposed on the discharge path, and
the charge path is provided for each voltage controlled switch.

8. A drive circuit that drives a plurality of voltage controlled switches mutually connected in parallel, in which a flywheel diode is connected in reverse parallel to each of the voltage controlled switches, the drive circuit comprising:
for each voltage controlled switch:
a charge path connected to a gate of the voltage controlled switch, through which gate charge current flows to turn the voltage controlled switch ON, the charge path including a power source path connected to a power source;
a branch path branched from the power path connected to the gate, the branch path including a charging side element disposed on a charging side loop path having the gate, a part of the charge path and an output terminal of the voltage controlled switch, the charging side element restricting a current flow in one direction and not disturbing a current flow of charge current, the charging side element allowing current to flow in a charging direction from a power path side to the gate and preventing current from flowing in a direction opposite to the charging direction;
a discharge path connected to the gate and the output terminal, through which gate discharge current flows to turn the voltage controlled switch OFF; and
a discharging side element disposed on a discharging side loop path having the gate, a part of the discharge path, and the output terminal, the discharging side element restricting a current flow to be in one direction and not disturbing a current flow of discharge current, the discharging side element being disposed on the part of the discharge path from each of the controlled switches to the discharge switch; and
a discharge switch disposed in the discharge path to be closer to an output terminal side than to the discharging side element, the discharge switch being shared by the plurality of voltage controlled switches,
wherein the charge path and the discharge path are separately provided to allow the charge current and the discharge current to flow through different paths.

9. The drive circuit according to claim 8, wherein the charging side element is a charging side diode with its anode connected to the power path side and its cathode connected to a gate side.

10. The drive circuit according to claim 8, wherein
the plurality of switches constitute parallel-connected circuits each composed of a series-connected upper arm portion and lower arm portion, the switch that constitutes the upper arm portion and the switch that constitutes the lower arm switch are configured to be alternately ON, and
the charging side element is a charge switch that prevents current from flowing in the charging direction when being turned OFF, and allows current to flow in the charging direction when being turned ON.

11. The drive circuit according to claim 8, wherein
a plurality of charging side loop paths are formed in the drive circuit, and
the charging side element is provided for each of the charging side loop paths.

* * * * *